United States Patent
Lai et al.

(10) Patent No.: US 11,984,351 B2
(45) Date of Patent: May 14, 2024

(54) CAVITY IN METAL INTERCONNECT STRUCTURE

(71) Applicant: Taiwan Semiconductor Manufacturing Co., Ltd., Hsinchu (TW)

(72) Inventors: Li-Shyue Lai, Jhube (TW); Gao-Ming Wu, Hsinchu (TW); Katherine H. Chiang, New Taipei (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 153 days.

(21) Appl. No.: 17/346,670

(22) Filed: Jun. 14, 2021

(65) Prior Publication Data

US 2022/0328346 A1    Oct. 13, 2022

Related U.S. Application Data

(60) Provisional application No. 63/174,116, filed on Apr. 13, 2021.

(51) Int. Cl.
*H01L 21/768* (2006.01)
*H01L 23/522* (2006.01)

(52) U.S. Cl.
CPC .. *H01L 21/76831* (2013.01); *H01L 21/76832* (2013.01); *H01L 21/76877* (2013.01); *H01L 23/5226* (2013.01)

(58) Field of Classification Search
CPC ........... H01L 21/7682; H01L 21/76831; H01L 21/76832; H01L 21/76883; H01L 21/76808; H01L 21/76849; H01L 23/5222; H01L 23/53295
See application file for complete search history.

(56) References Cited

U.S. PATENT DOCUMENTS

| 6,165,897 A | 12/2000 | Jang |
| 9,553,019 B1* | 1/2017 | Briggs ............. H01L 21/76816 |
| 2002/0127844 A1 | 9/2002 | Grill et al. |
| 2008/0265369 A1 | 10/2008 | Liaw |
| 2009/0309230 A1* | 12/2009 | Cui ................... H01L 23/53238 257/773 |

(Continued)

FOREIGN PATENT DOCUMENTS

TW    201944573 A    11/2019

*Primary Examiner* — Jaehwan Oh
*Assistant Examiner* — John M Parker
(74) *Attorney, Agent, or Firm* — Eschweiler & Potashnik, LLC

(57) ABSTRACT

An integrated circuit device includes a dielectric structure within a metal interconnect over a substrate. The dielectric structure includes a cavity. A first dielectric layer provides a roof for the cavity. A second dielectric layer provides a floor for the cavity. A material distinct from the first dielectric layer and the second dielectric layer provides a side edge for the cavity. In a central area of the cavity, the cavity has a constant height. The height may be selected to provide a low parasitic capacitance between features above and below the cavity. The roof of the cavity may be flat. A gate dielectric may be formed over the roof. The dielectric structure is particularly useful for reducing parasitic capacitances when employing back-end-of-line (BEOL) transistors.

20 Claims, 26 Drawing Sheets

(56) References Cited

U.S. PATENT DOCUMENTS

| | | | |
|---|---|---|---|
| 2010/0181678 A1* | 7/2010 | Edelstein | H01L 21/76883 |
| | | | 430/311 |
| 2010/0330722 A1 | 12/2010 | Hsieh et al. | |
| 2013/0323930 A1* | 12/2013 | Chattopadhyay | ............................ |
| | | | H01L 21/76829 |
| | | | 156/345.26 |
| 2015/0318206 A1* | 11/2015 | Su | H01L 23/53295 |
| | | | 438/637 |
| 2018/0151622 A1 | 5/2018 | Soundara Pandian et al. | |
| 2019/0157099 A1 | 5/2019 | Chen et al. | |
| 2019/0237356 A1 | 8/2019 | Srivastava et al. | |
| 2019/0292042 A1 | 9/2019 | Liu et al. | |
| 2020/0006228 A1 | 1/2020 | Yang et al. | |
| 2020/0090999 A1 | 3/2020 | Hsu et al. | |
| 2020/0127109 A1 | 4/2020 | Wang et al. | |
| 2020/0136038 A1 | 4/2020 | Manfrini et al. | |
| 2020/0176267 A1 | 6/2020 | Hsiao et al. | |

* cited by examiner

CAVITY IN METAL INTERCONNECT STRUCTURE

REFERENCE TO RELATED APPLICATION

This application claims the benefit of U.S. Provisional Application No. 63/174,116, filed on Apr. 13, 2021, the contents of which are incorporated herein by reference in their entirety.

BACKGROUND

Integrated circuit devices may include millions or billions of transistors. The transistors are configured to act as switches and/or to produce power gains so as to enable logical functionality for an integrated chip (e.g., form a processor configured to perform logic functions). Integrated chips may also include large numbers of passive devices, such as capacitors, resistors, inductors, varactors, and the like. Passive devices are widely used to control integrated chip characteristics, such as gains, time constants, etc. Active and passive devices may be used to provide memory in large scale arrays.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B through 17A and 17B a series of paired cut-away side view illustrations and cut-away perspective view illustrations exemplifying a method of forming an IC device such as the IC device of FIG. 1.

DETAILED DESCRIPTION

Figure 1A:
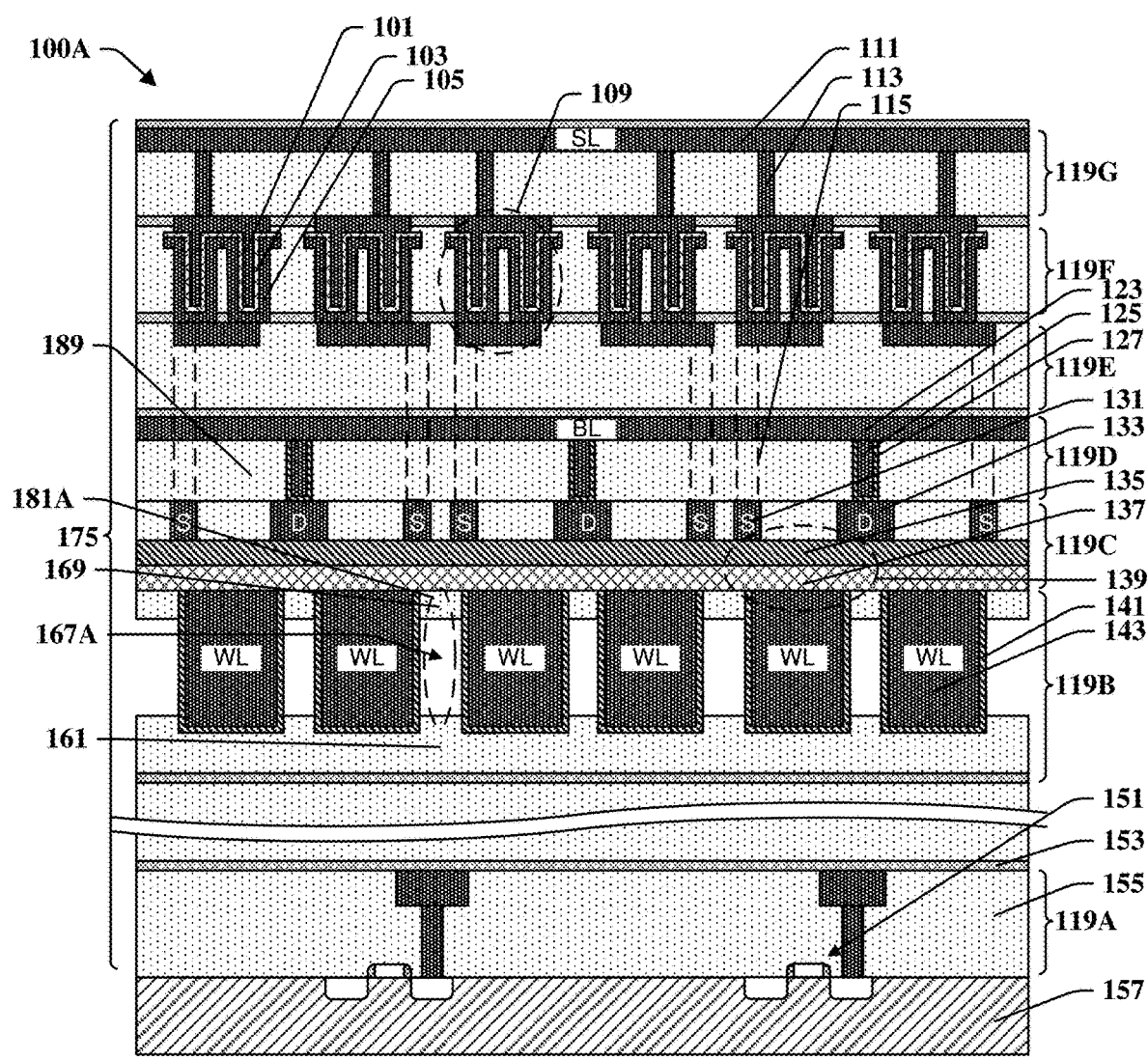
FIGS. 1A-1E illustrate integrated circuit (IC) devices according to various aspects of the present teachings.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Front-end-of-line (FEOL) transistors may be a bottleneck in the drive toward higher density non-volatile memories (NVMs). High density random access memory may dictate a write current greater than 200 $\mu A/\mu m$. Larger transistors or multiple transistors operated in parallel may be needed to support a current of that magnitude. For example, some designs suggest the use of two or more transistors for each memory cell to provide sufficient drive current. Those approaches pose a large FEOL area penalty.

To avoid that penalty, back-end-of-line (BEOL) transistors may be used as access control devices for memory cells. Both the BEOL transistors and the memory cells may be disposed between various metallization layers within a metal interconnect disposed above a substrate. Placing the access control devices within the metal interconnect frees up space at the substrate surface and thereby provides added flexibility for device integration.

A potential drawback of placing the access control devices within the metal interconnect is increased parasitic capacitance between adjacent word lines and between the word lines and bit lines or source lines. Parasitic capacitance may be reduced by lowering a dielectric constant of a dielectric structure disposed between the capacitively coupled structures. One way of lowering the dielectric constant is to introduce one or more cavities (air gaps) into the dielectric structure. Cavities may be formed by etching high aspect ratio trenches and pinching off the tops of the trenches. This approach has been determined to have limited effectiveness for a memory array that uses BEOL transistors as access control devices.

Some aspects of the present teachings relate to an integrated circuit device that includes a dielectric structure within a metal interconnect over a substrate. A cavity is formed within the dielectric structure. A first dielectric layer provides a roof for the cavity. A second dielectric layer provides a base for the cavity. The cavity has side edges. A third material provides at least one of the side edges. In some embodiments, the third material is a dielectric having a composition that is distinct from the first dielectric layer and from the second dielectric layer. In some embodiments the third material is a non-dielectric. In some embodiments the third material is an oxide semiconductor.

The cavity may have a smooth ceiling. In a central area of the cavity, the central area being an area away from the side edges, the cavity may have a constant height. The height of the cavity may be selected to provide a low parasitic capacitance between features above and features below the cavity. In some embodiments, a ceiling of the cavity is flat in the central area. The upper dielectric layer may have a uniform thickness. These features facilitate the formation of uniform and stable structure above the cavity. In some embodiments a layer of material that provides a gate dielectric for a BEOL transistor is directly over the dielectric structure. In these embodiments, the dielectric structure with the cavity improves a breakdown voltage for the BEOL transistor.

Some aspects of the present teachings relate to a method of forming an integrated circuit device that includes a cavity within a metal interconnect over a substrate The method includes forming a stack comprising a bottom layer, a middle layer, and a top layer. The middle layer has a distinct composition from the bottom layer and the top layer. All or part of the middle layer is selectively etched away through openings formed in the top layer to form the cavity. The openings may then be sealed. The resulting cavity has a structure that is conducive to reducing capacitive coupling between conductive features in a metal interconnect. The height of the cavity may be precisely controlled. In the finished product, the middle layer may have half or less an area of the top layer or an area of the bottom layer or the middle layer may be absent entirely. If some portion of the middle layer remains after etching, it forms a side edge for the cavity. The original middle layer may have had a thickness greater than a thickness of the bottom layer or a thickness of the top layer, whereby the cavity may be a large portion of the stack volume. In some embodiments the stack includes additional layers and a plurality of vertically stacked cavities are formed by the selective etching.

In some embodiments, metal features are formed in the stack prior to the selective etching that forms the cavities. The metal features may be lines or vias. The selective etching may remove the middle layer from around the metal features. In some embodiments, the cavity completely surrounds a two or more vias, whereby the vias form posts within the cavity. In some embodiments, the cavity extends a majority of a distance between adjacent parallel lines. In some embodiments, the cavity extends from one line to another line whereby one of the lines provides a first side edge for the cavity and the other line provides a second side edge for the cavity.

In some embodiments, the metal features comprise a metal lined with a second material. The second material forms a liner for the metal feature and may also form a side edge for the cavity. The second material may be selected to increase a structural strength of the cavity. In other words, the second material may have a greater strength characteristic than the metal. In some embodiments, the liner is conductive and extends underneath and up the sides of the metal feature. In some embodiments, the liner is an oxide semiconductor. In some embodiments, the oxide semiconductor is annealed prior to the selective etching that forms the cavity. The annealing may increase the structural strength of the oxide semiconductor. In some embodiments, the liner provides a side edge for the cavity.

In some embodiments, the upper dielectric layer has an upper surface vertically aligned with an upper surface of a metal structure. In some embodiments, the lower dielectric layer has a lower surface vertically aligned with a lower surface of the metal structure. In some embodiments, a residual portion of a middle dielectric layer forms a side edge of the cavity and extends from the upper dielectric layer to the lower dielectric layer. In some embodiments, the upper dielectric layer and the lower dielectric layer are oxide layers. In some embodiments, the middle dielectric layer is a nitride layer.

Although cavities according to the present teachings may be useful in any metal interconnect, these cavities have particular value in a metal interconnect that includes transistors. The flat roof of the cavity is conducive to forming a uniform layer over the roof. In some embodiments, a transistor gate dielectric layer is formed over the roof. In some embodiments, the cavity is between two adjacent word lines that are within the metal interconnect. The two adjacent word lines are at a same level in the metal interconnect and may be separated across the width of the cavity. In some embodiments, the cavity is between a word line that is within the metal interconnect and a source line or a bit line that is also within the metal interconnect. The word line may be in one metallization layer and the source line or the bit line may be in another metallization layer. The word line and the source line or the bit line may be separated across the height of the cavity. The cavity may be in a level of the metal interconnect that contains vias. In some embodiments, the vias are in a second metallization layer above a first metallization layer that contains the word lines. In some embodiments, cavities are disposed between adjacent word lines in a first metallization layer and additional cavities in a second metallization layer are disposed between the word lines and the source lines or the bit lines.

FIG. 1A illustrates an IC device 100A that includes a metal interconnect 175 over a substrate 157. The metal interconnect 175 comprises a plurality of stacked metallization layers 119A-119G. Seven metallization layers 119A-119G are illustrated, but the metal interconnect 175 may have a greater or lesser number of metallization layers. An array of capacitors 109 is disposed within the metallization layer 119F. In the IC device 100A, the capacitors 109 are operative as memory cells. Alternatively, the array of capacitors 109 could be operative for another purpose. Also, any suitable type of memory cell may be used in place of the capacitors 109.

An array of back-end-of-line (BEOL) transistors 139 is disposed within the metallization layer 119B and the metallization layer 119C. The BEOL transistors 139 are operative as access control devices for the capacitors 109 but could be used for another purpose. Word lines (WLs) 143 in the metallization layer 119B provide gate electrodes for the BEOL transistors 139. Conductive islands in the metallization layer 119C provide source regions 131 and drain regions 133 for the BEOL transistors 139. A channel layer 135 provides channels for the BEOL transistors 139 and a gate dielectric layer 137 provides gate dielectrics for the BEOL transistors 139.

Bit lines (BLs) 123 and vias 125 coupling the BLs 123 to the drain regions 133 are disposed in the metallization layer 119D. Vias 115 that couple the source regions 131 to bottom electrodes 105 of the capacitors 109 are also disposed in the metallization layer 119D. Source lines (SLs) 111 and vias 113 coupling the SLs 111 to top electrodes 101 of the capacitors 109 may be formed in the metallization layer 119G. It will be appreciated that the arrangement of WLs 143, BLs 123, and SLs 111 may be varied. For example, the SLs 111 may be in the metallization layer 119D and the BLs 123 may be in the metallization layer 119G.

Figure 2A:
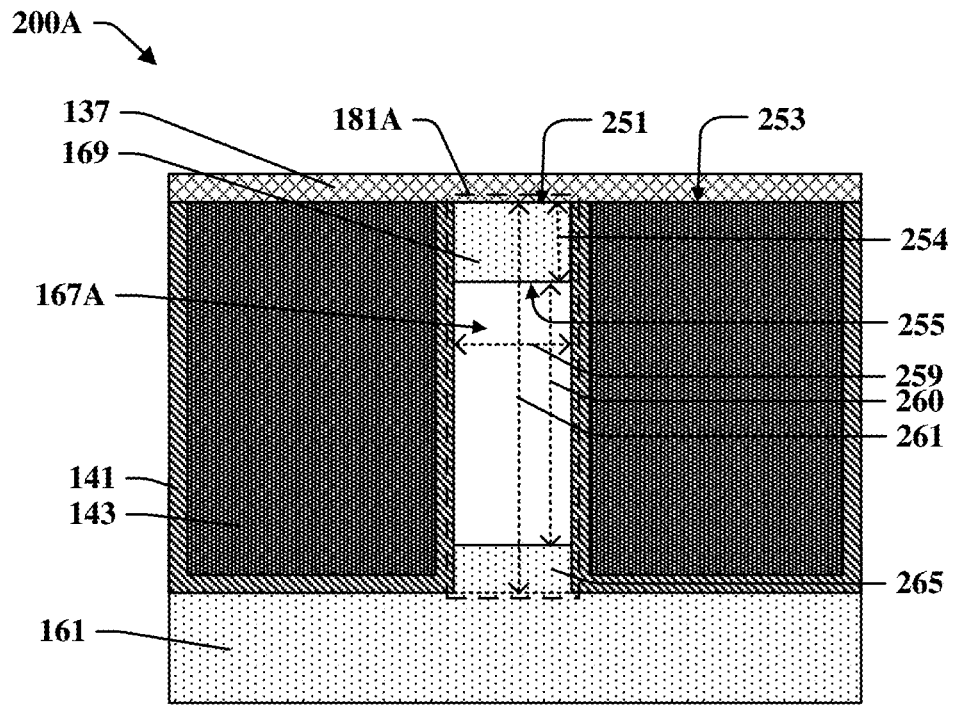
FIGS. 2A-2D illustrate dielectric structures according to some aspects of the present teachings, which may be used in the IC devices of FIGS. 1A-1E.

The IC device 100A includes a dielectric structure 181A, which is illustrated in greater detail by the cross-sectional view 200A of FIG. 2A. The dielectric structure 181A is disposed between adjacent WLs 143 and includes an upper dielectric layer 169, a lower dielectric layer 265, and a cavity 167A between the two. The upper dielectric layer 169 forms a roof over the cavity 167A and provides a flat ceiling 255 for the cavity 167A. The upper dielectric layer 169 has a uniform thickness over the cavity 167A and has an upper surface 251 that is flat and coplanar with an upper surface 253 of the WLs 143. This structure facilitates providing the gate dielectric layer 137 with stability and a uniform thickness and thereby reduce time dependent dielectric breakdown (TDDB) in the BEOL transistors 139.

The dielectric structure 181A has a height 261 that equals a height of the WLs 143. The lower dielectric layer 265 may be contiguous with a dielectric layer 161 that extends under the WLs 143 or may be separated from the dielectric layer 161 by an etch stop layer or the like. In some embodiments, the height 261 is in the range from about 1 nm to about 400 nm. In some embodiments, the height 261 is in the range from about 50 nm to about 200 nm.

The ceiling 255 may be smooth and a height 260 of the cavity 167A may be constant over most or all of the cavity 167A. The height 260 of the cavity 167A may be of the same order of magnitude as the height 261 of the dielectric structure 181A. In some embodiments, the height 260 is in the range from about 1 nm to about 200 nm. In some embodiments, the height 260 is in the range from about 10 nm to about 100 nm. In some embodiments, the height 260 is less than about 50 nm. If the height 260 is too great, the device may breakdown and TDDB may be worse. If the height 260 is too small, a desired reduction in parasitic capacitive coupling may not be achieved.

In some embodiments, the height 260 of the cavity 167A is from 10% to 90% the height 261 of the dielectric structure 181A. In some embodiments, the height 260 of the cavity 167A is from 30% to 70% the height 261 of the dielectric structure 181A. In some embodiments, from 10% to 90% of the dielectric structure 181A is cavity space. In some embodiments, from 30% to 70% of the dielectric structure 181A is cavity space. In this example, the cavity space is provided by the cavity 167A, but additional cavities vertically stacked with the cavity 167A between WLs 143 may contribute to the percentage of the dielectric structure 181A that is cavity space.

In some embodiments, a thickness 254 of the upper dielectric layer 169 is between 20% and 100% of the height 260 of the cavity 167A. In some embodiments, the height 260 is greater the thickness 254. If the upper dielectric layer 169 is too thin, it may be consumed during the cavity formation process. If the upper dielectric layer 169 is too thick, it may be difficult to provide a desired cavity space. The cavity 167A reduces capacitive coupling between adjacent WLs 143. In some embodiments, the reduction in capacitive coupling is 10% or greater. In some embodiments, the reduction in capacitive coupling is 20% or greater. In some embodiments, the reduction in capacitive coupling is 30% or greater.

In some embodiments, a width 259 of the of the cavity 167A is in the range from about 1 to about 200 nm. In some embodiments, the width 259 is in the range from about 10 nm to about 50 nm. A lengths of the cavity 167A (depth into the page of FIG. 2A) may be much greater than the width 259. In some embodiments, the width 259 of the cavity 167A is one fourth or more the height 260 cavity 167A. In some embodiments, the width 259 is half or more the height 260. In some embodiments, the width 259 is greater than or equal to the height 260. These dimensions are possible because the cavity 167A is formed by etching away a sacrificial layer rather than by non-conformal deposition over a trench.

The WLs 143 may have liners 141 that are exposed within the cavity 167A and provide side edges for the cavity 167A. Within the cavity 167A, the liners 141 may extend from the lower dielectric layer 265 to the upper dielectric layer 169 and have a composition that is distinct from that of the lower dielectric layer 265 and from that of the upper dielectric layer 169. In some embodiments, the liners 141 comprises an oxide semiconductor. In some embodiments, the oxide semiconductor is in crystalline form. In some embodiments, the oxide semiconductor is a metal oxide semiconductor. In some embodiments, the liners 141 have a thickness in the range from about 0.1 nm to about 20 nm. In some embodiments, the liners 141 have a thickness in the range from about 0.5 nm to about 10 nm. If the liners 127 are too thick it may be difficult to form a metal portion of the WLs 143 or a resistance of the WLs 143 may be undesirably increased. If the liners 127 are too thin the liners 127 may not be structurally sound. The oxide semiconductor may be, for example zirconium oxide ($ZrO2$), indium oxide ($InO2$), indium gallium zinc oxide (IGZO), gallium oxide ($Ga_2O_3$), zinc oxide (ZnO), magnesium oxide (MgO), gadolinium oxide (GdO), indium tin oxide (InTnO), indium titanium oxide (InTiO), or the like. The oxide semiconductor may be doped to increase conductivity. In some embodiments, the oxide semiconductor is heavily doped. In some embodiments, the oxide semiconductor has n-type dopants or p-type dopants in a concentration that is $10^{19}/cm^3$ or greater. In some embodiments, the oxide semiconductor has n-type dopants or p-type dopants in a concentration that is $10^{20}/cm^3$ or greater.

The substrate 157 may be any type of substrate. The substrate may be in the form of a wafer or die. In some embodiments, the substrate 157 comprises a semiconductor body (e.g., silicon, SiGe, SOI, etc.) and other semiconductor and/or epitaxial layers, associated therewith. Various devices such as transistors 151 may be formed in or on the semiconductor body. With reference to FIG. 1A, the metallization layers 119A-119G may each include an interlevel dielectric (ILD) layer 155 and various metal features. The ILD layers 155 may individually comprise an oxide, a low-κ dielectric (dielectric constant less than 3.9), or an extremely low-κ dielectric (dielectric constant 2.1 or less). The ILD layers 155 may comprise one or more of silicon dioxide, borosilicate glass (BSG), phosphorus silicate glass (PSG), borophosphosilicate glass (BPSG), fluorosilicate glass (FSG), undoped silicate glass (USG), or the like. The metal features such as WLs 143, vias 125, BLs 123, vias 113, and SLs 111 may each be any one or a combination of copper (Cu), tungsten (W), aluminum (Al), ruthenium (Ru), titanium (Ti) tantalum (Ta), titanium nitride (TiN), tantalum nitride (TaN), or the like. The metallization layers 119A-119G may be separated by etch stop layers 153. The etch stop layers 153 may be, for example, one or more layers of a nitride, a carbide, an oxynitride, an oxycarbide, or the like.

The capacitors 109 may comprises a top electrode 101 and a bottom electrode 105 separated by a capacitor dielectric 103. Each of the top electrode 101 and the bottom electrode 105 may comprise a metal such as aluminum (Al), copper (Cu), tantalum (Ta), titanium (Ti), tantalum nitride (TaN), titanium nitride (TiN), tungsten (W), a combination thereof, or the like. The capacitor dielectric 103 may comprise a high-κ dielectric or some other dielectric. In some embodiments, the capacitor dielectric 103 comprises one or more of aluminum oxide ($Al_2O_3$), hafnium oxide ($HfO_2$), silicon dioxide ($SiO_2$), silicon carbide (SiC), silicon mononitride (SiN), silicon nitride ($Si_3N_4$), tantalum nitride ($Ta_2O_5$), tantalum oxynitride (TaON), titanium oxide ($TiO_2$), zirconium oxide ($ZrO_2$), or the like. In some embodiments, the capacitor dielectric 103 comprises an ONO layer including a lower oxide (O) layer, a middle nitride (N), and an upper oxide (O) layer.

Figure 1B:
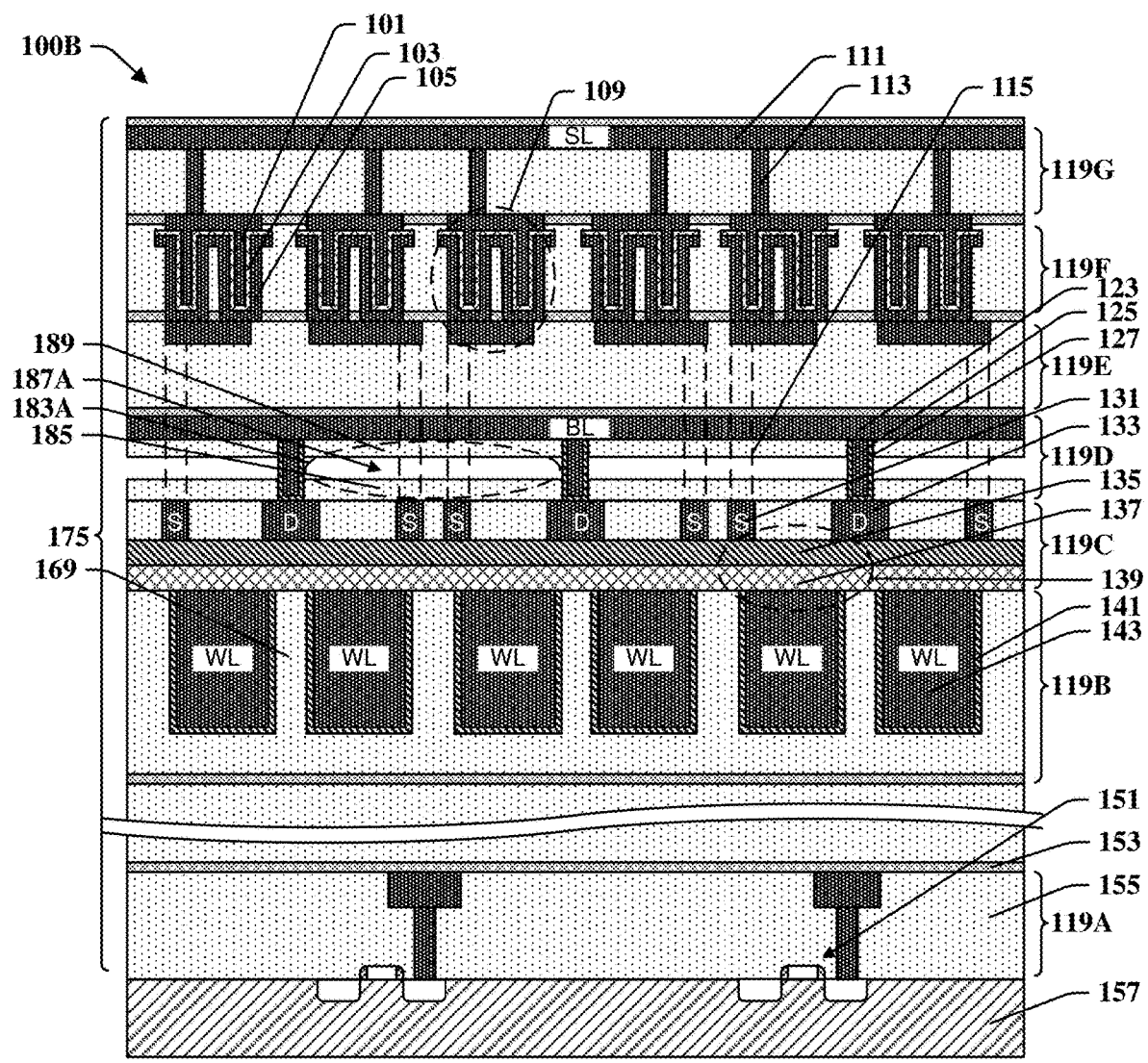
Figure 2B:
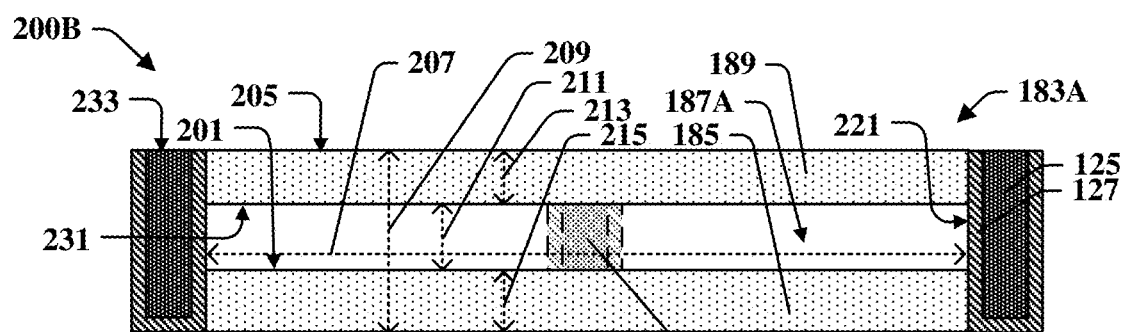

FIG. 1B illustrates an IC device 100B that is similar to the IC device 100A of FIG. 1A but includes a dielectric structure 183A according to the present teachings rather than the dielectric structure 181A. FIG. 2B provides a cross-sectional 200B illustrating the dielectric structure 183A in greater detail. The dielectric structure 183A includes an upper dielectric layer 189, a lower dielectric layer 185, and a cavity 187A between the two. The value ranges given for the dielectric structure 181A apply to corresponding elements in the dielectric structure 183A. A principal difference is that whereas the cavities 167A are disposed between adjacent WLs 143, the cavity 187A extends between and around the vias 125 and the vias 115 whereby a width of the cavity 187A may be much greater than a distance 207 between vias 125. In some embodiments, the distance 207 is in the range from about 1 nm to about 500 nm. In some embodiments, the distance 207 is in the range from 10 to 200 nm. The vias 125 have liners 127 that may be exposed to provide side edges 221 within the cavity 187A. The description of the liners 141 applies to the liners 127. The vias 125 and the vias 115 may form pillars within the cavity 187A and the cavity 187A may include a plurality of such pillars.

The upper dielectric layer 189 has a thickness 213. The lower dielectric layer has a thickness 215. The cavity 187A has a height 211. The thickness 213 and the thickness 215 may be approximately equal. In some embodiments, the height 211 is from about one to about five times the thickness 213 and from about one to about five times the thickness 215. Accordingly, the height 211 of the cavity 187A may be from about 33% to about 71% the height 209 of the dielectric structure 183A and a volume of the cavity 187A may be from about 33% to about 71% a volume of the dielectric structure 183A.

The cavity 187A within the dielectric structure 183A may reduce capacitive coupling between structures above and structure below the dielectric structure 183A. For example, the dielectric structure 183A may reduce the capacitive coupling between WLs 143 and BLs 123 or between WLs 143 and SLs 111. In some embodiments, the reduction in capacitive coupling is 10% or greater. In some embodiments, the reduction in capacitive coupling is 20% or greater. In some embodiments, the reduction in capacitive coupling is 30% or greater.

The height 211 may be uniform across all or at least a central portion of the cavity 187A. As a corollary, a shape (topography) of the ceiling 231 may conform to a shape of the floor 201. In some embodiments, the floor 201 and the ceiling 231 of the cavity 187A are flat. In some embodiments, the thickness 213 of the upper dielectric layer 189 is uniform over the cavity 187A. These features facilitate providing the upper dielectric layer 189 with a flat top 205. In some embodiments, the top 205 of the upper dielectric layer 189 is coplanar with a top 233 of the vias 125.

Figure 1C:
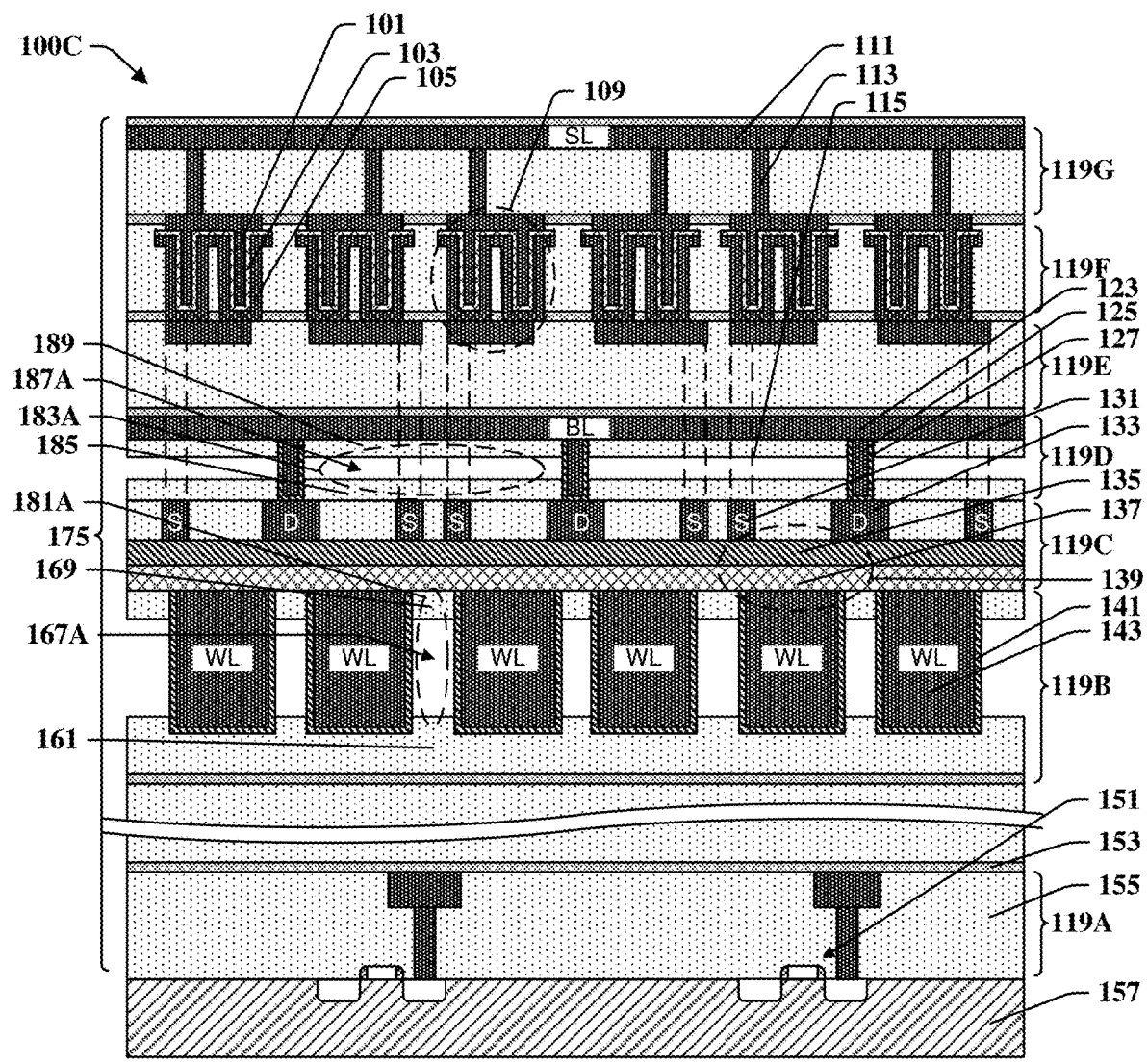

FIG. 1C illustrates an IC device 100C that is similar to the IC device 100A of FIG. 1A but includes both the dielectric structure 181A of the IC device 100A and the dielectric structure 183A of the IC device 100B of FIG. 1B. As illustrated by this embodiment, both dielectric structures may be used in one device. The reductions in capacitive coupling provided by the cavities 187A and the cavities 167A may be additive for improving the overall performance of the IC device 100C.

The IC device 100C is illustrated as including the dielectric structures 181A with cavities 167A and the dielectric structures 183A with cavities 187A arranged around BEOL transistors 139 that are used as access control devices for a memory that include capacitors 109. However, the dielectric structures 181A and the dielectric structures 183A may individually be used in a different type of IC device and at any location within a BEOL interconnect structure. The BEOL transistors 139 may be configured for a purpose other than for use as access control devices. A different type of memory cell may be used in place of the capacitors 109. The memory cells may correspond to resistive random access memory (ReRAM), magnetoresistive random access memory (MRAM), ferroelectric random access memory (FeRAM), phase-change memory (PCM), oxygen displacement memory (OxRAM), conductive bridging random access memory (CBRAM), carbon nanotube random access memory (NRAM), the like, or any other type of memory.

Figure 1D:
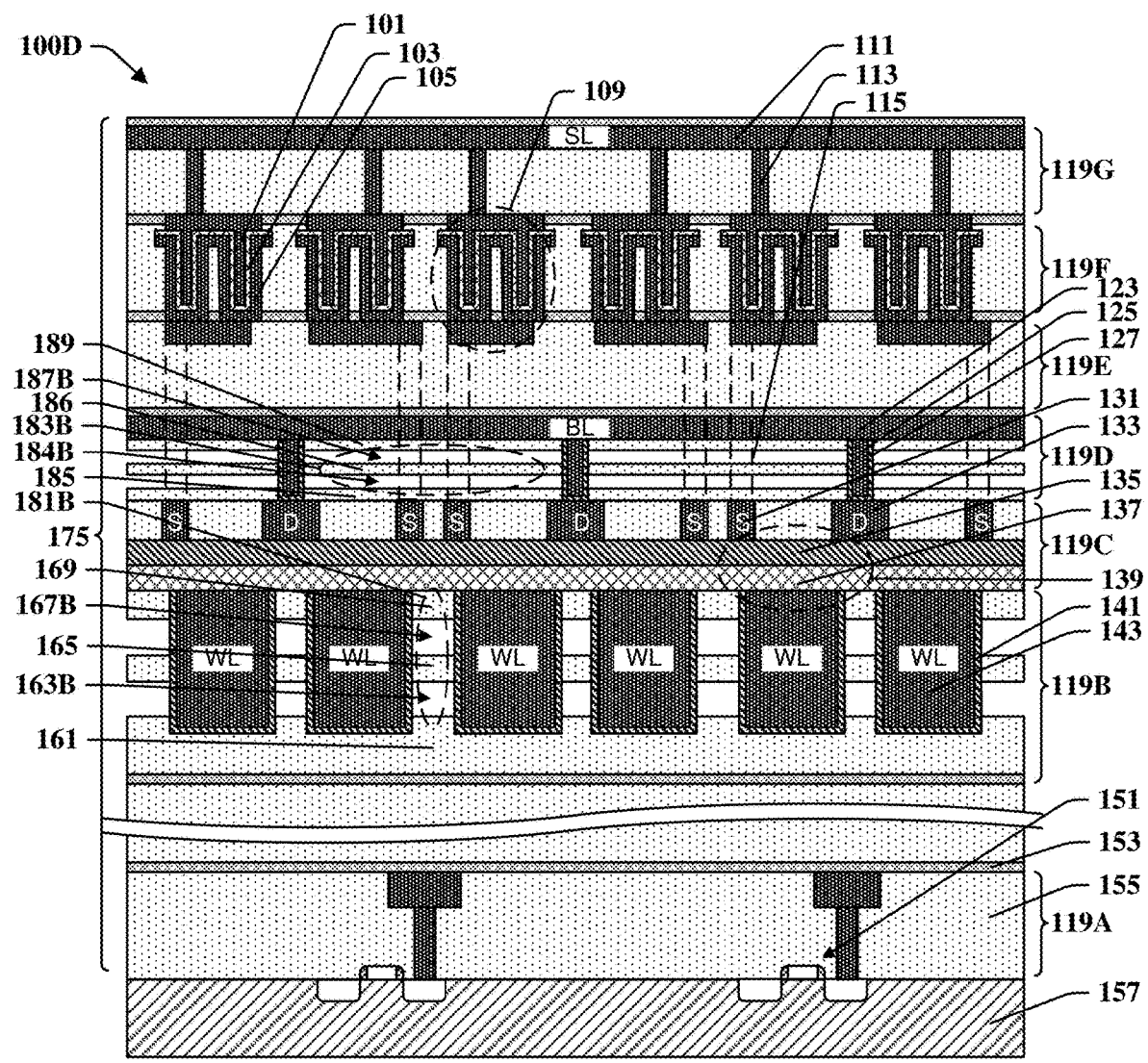

FIG. 1D illustrates an IC device 100D that is similar to the IC device 100C of FIG. 1C except that it includes the dielectric structure 181B in place of the dielectric structure 181A and the dielectric structure 183B in place of the dielectric structure 183A. The dielectric structure 181B is further illustrated by the cross-sectional view 200C of FIG. 2C and the dielectric structure 183B is further illustrated by the cross-sectional view 200D of FIG. 2D. As can be seen from these drawings, the dielectric structure 181B and the dielectric structure 183B differ from the dielectric structure 181A and the dielectric structure 183A in that they include additional cavities and additional dielectric layers in a vertical stack.

Figure 2C:
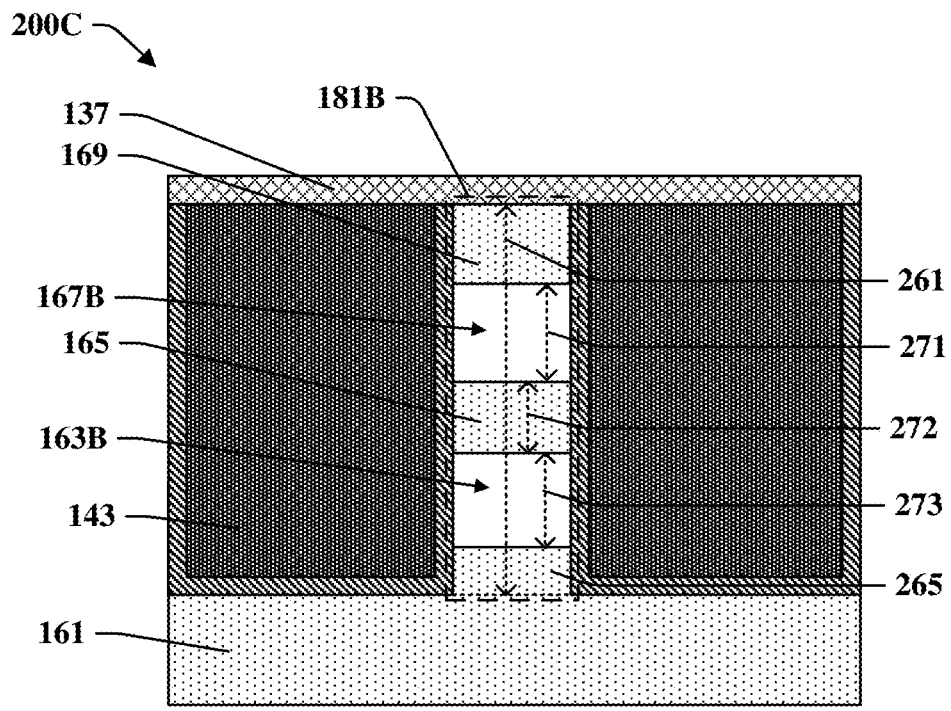

Referring to FIG. 2C, the dielectric structure 181B include a middle dielectric layer 165 disposed between the upper dielectric layer 169 and the lower dielectric layer 265. A first cavity 167B having a height 271 is formed between the upper dielectric layer 169 and the middle dielectric layer 165. A second cavity 163B having a height 273 is formed between the middle dielectric layer 165 and the lower dielectric layer 265.

In some embodiments, the height 271 and the height 273 of the cavities are each in the range from about 1 nm to about 200 nm. In some embodiments, the height 271 and the height 273 are each in the range from about 10 nm to about 100 nm. In some embodiments, the height 271 and the height 273 are each less than about 50 nm. If the height 271 or the height 273 is too great, the device may breakdown and TDDB made worse. If the height 271 or the height 273 is too small, a desired reduction in parasitic capacitive coupling may not be achieved.

The upper dielectric layer 169 and the middle dielectric layer 165 may each have a thickness 272 that is from about 20% to about 100% the height 271 or the height 273. If the middle dielectric layer 165 is too thin, it may be consumed during the cavity formation process. If the middle dielectric layer 165 is too thick, the effective capacitive volume may be too small. In some embodiments, the total cavity space height, which is a sum of the height 271 and the height 273, is from about 40% to about 77% the height 261 of the dielectric structure 181B. Likewise, in some embodiments, total volume of the cavity 163B and the cavity 167B is from about 40% to about 77% of the volume of the dielectric structure 181B.

Figure 2D:
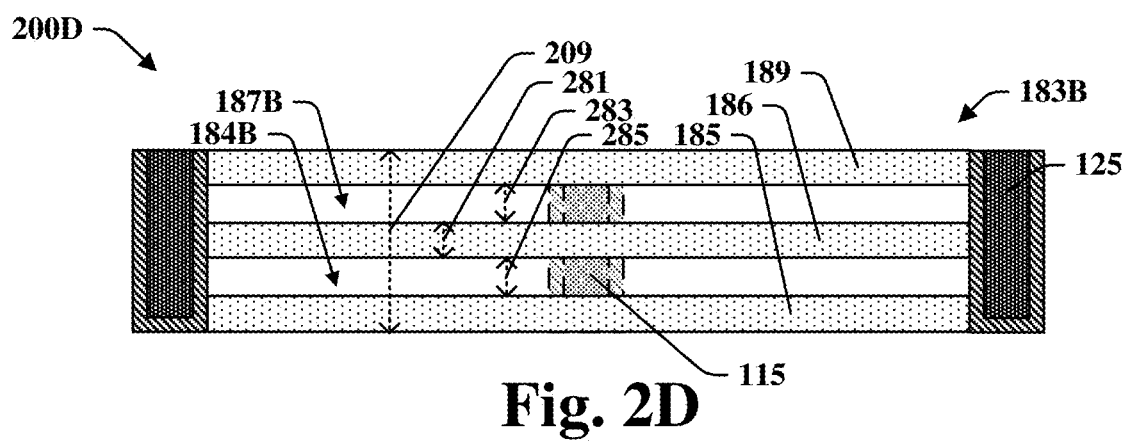

Referring to FIG. 2D, the dielectric structure 183B include a middle dielectric layer 186 disposed between the upper dielectric layer 189 and the lower dielectric layer 185. A first cavity 187B having a height 283 is formed between the upper dielectric layer 189 and the middle dielectric layer 186. A second cavity 184B having a height 285 is formed between the middle dielectric layer 186 and the lower dielectric layer 185.

In some embodiments, the height 283 and the height 285 of the cavities are each in the range from about 1 nm to about 200 nm. In some embodiments, the height 283 and the height 285 are each in the range from about 10 nm to about 100 nm. In some embodiments, the height 283 and the height 285 are each less than about 50 nm.

The middle dielectric layer 186 may have a thickness 281 that is from about 20% to about 100% the height 283 or the height 285. In some embodiments, the total cavity space height, which is a sum of the height 283 and the height 285, is from about 40% to about 77% the height 209 of the dielectric structure 183B. Likewise, in some embodiments, total volume of the cavity 184B and the cavity 187B is from about 40% to about 77% of the volume of the dielectric structure 183B.

Figure 1E:
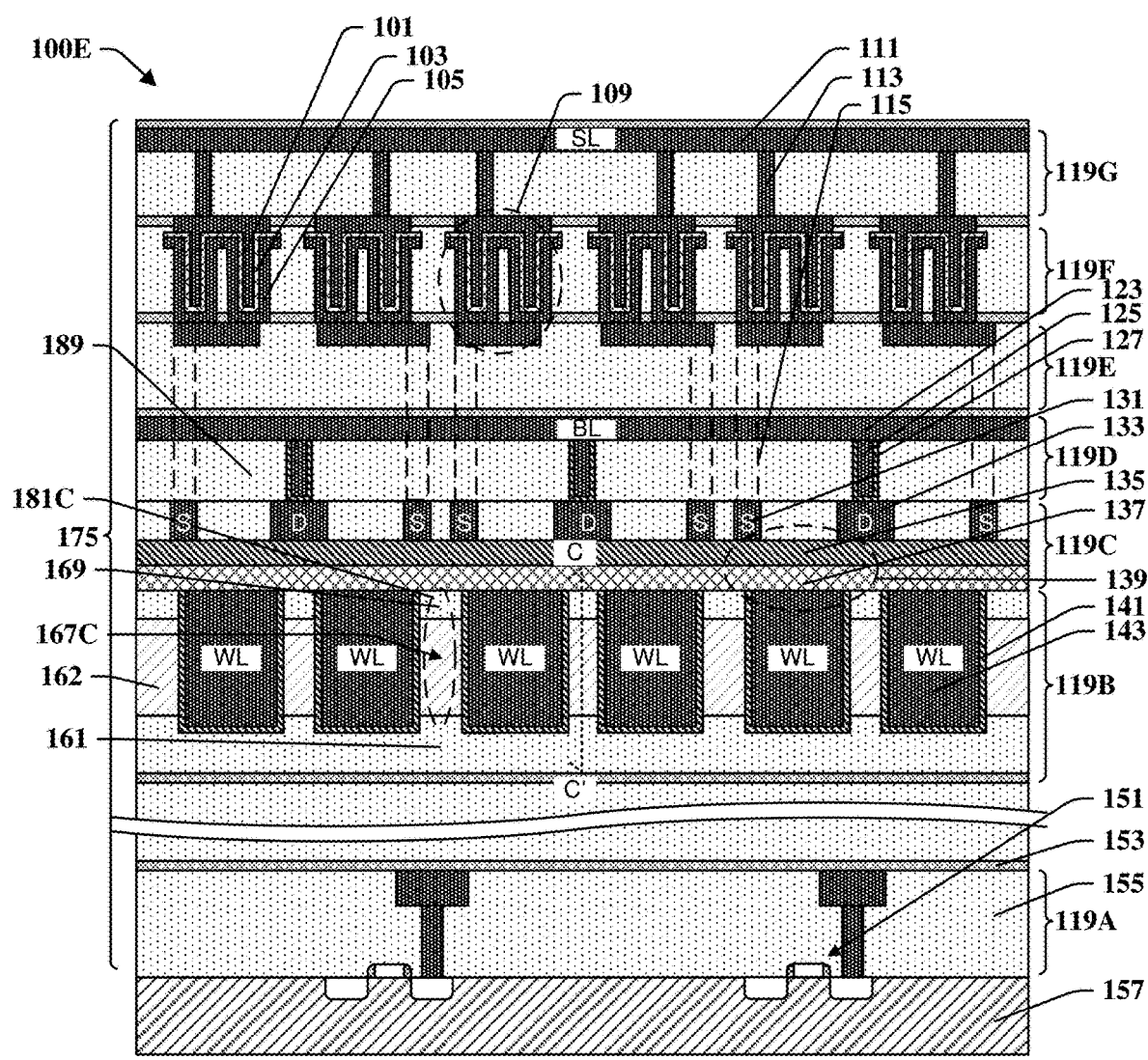
Figure 3:
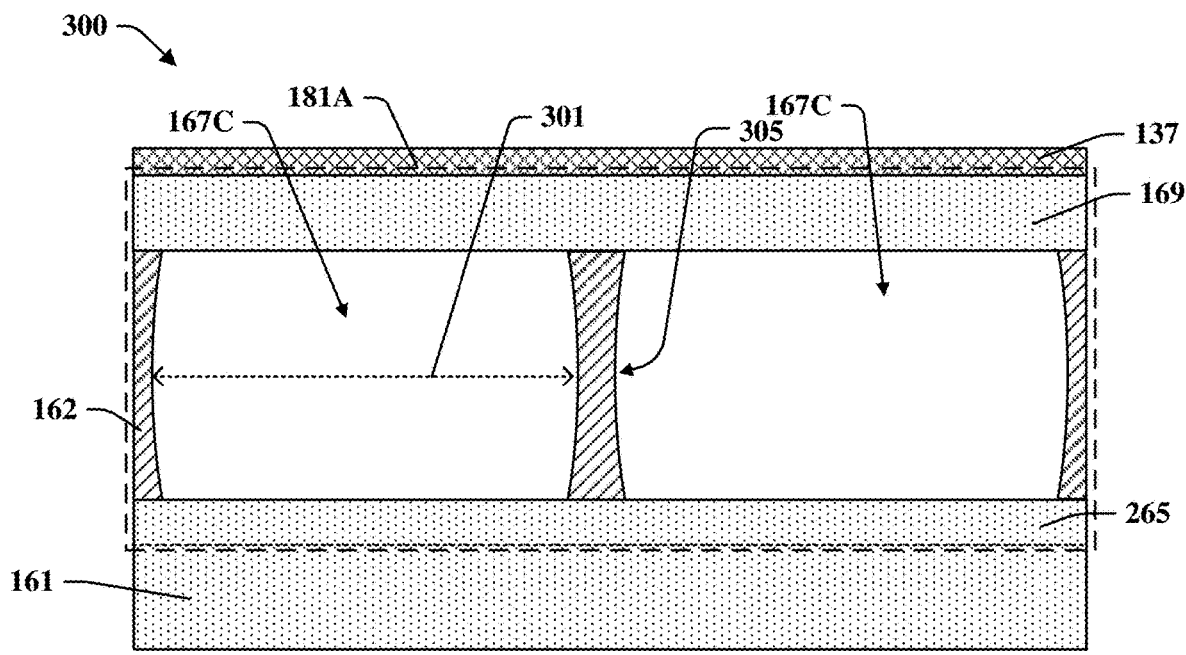
FIG. 3 provides a cross sectional view along the line C-C' of FIG. 1E.

FIG. 1E illustrates an IC device 100E that is similar to the IC device 100A of FIG. 1A except that it includes the dielectric structure 181C in place of the dielectric structure 181A. The dielectric structure 181C is illustrated by the cross-sectional view 300 of FIG. 3. The cross-sectional view 300 of FIG. 3 is taken along the line C-C' of FIG. 1E. As can be seen from these figures, the dielectric structure 181C has cavities 167C, which differ from the cavities 167A due to the presence of a third dielectric 162. The third dielectric 162 has a composition that is distinct from a composition of the upper dielectric layer 169 and from a composition of the lower dielectric layer 265. In some embodiments, the upper dielectric layer 169 and the lower dielectric layer 265 are oxides and the third dielectric 162 is a nitride.

The third dielectric 162 forms side edges 305, which limit a length of the cavities 167C in a direction parallel to the WLs 143. In some embodiments, the length 301 is in the range from about 10 nm to about 500 nm. In some embodiments, the length 301 is in the range from about 50 nm to about 200 nm. In some embodiments, the length 301 is greater than the width 259 (see FIG. 2A) between WLs 143. The third dielectric 162 may be left to avoid long etching times when forming the cavities 167C.

FIGS. 4A and 4B through 17A and 17B are a series of paired cut-away side view illustrations and cut-away perspective view illustrations exemplifying a method of forming an IC device with cavities according to the present teachings. While FIGS. 4A and 4B through 17A and 17B are described with reference to various embodiments of a method, it will be appreciated that the structures shown in FIGS. 4A and 4B through 17A and 17B are not limited to the method but rather may stand alone separate from the method. While FIGS. 4A and 4B through 17A and 17B are described as a series of acts, it will be appreciated that the order of the acts may be altered in other embodiments. While FIGS. 4A and 4B through 17A and 17B illustrate and describe a specific set of acts, some acts that are illustrated and/or described may be omitted in some embodiments. Further, acts that are not illustrated and/or described may be included.

Figure 4A:
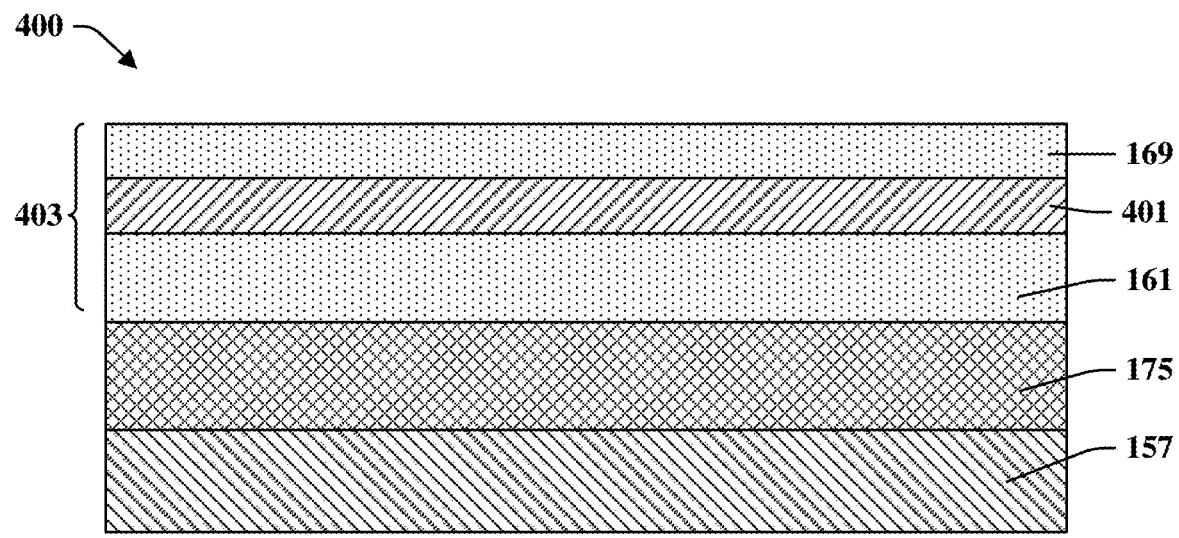
Figure 4B:
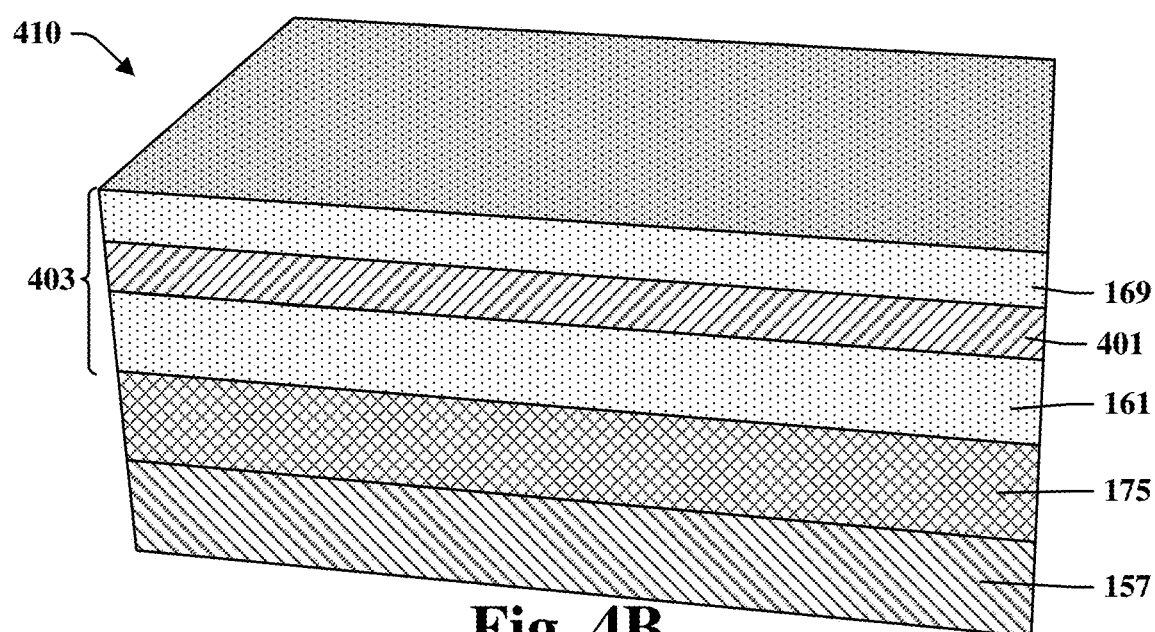

As show by the cross-sectional view 400 of FIG. 4A and the perspective view 410 of FIG. 4B the method may begin with forming a multilayer stack 403 over a lower portion of the metal interconnect 175, which is itself formed over the substrate 157. The multilayer stack 403 includes at least the lower dielectric layer 161, the upper dielectric layer 169, and a sacrificial layer 401. The multilayer stack 403 may include additional layers, such as the middle dielectric layer 165 (see FIG. 1D) and a second sacrificial layer. The sacrificial layer 401 has a composition that is distinct from compositions of the lower dielectric layer 161 and the upper dielectric layer 169. In some embodiments, the lower dielectric layer 161 and the upper dielectric layer 169 are oxide layers. In some embodiments, the sacrificial layer 401 is a nitride layer.

Figure 5A:
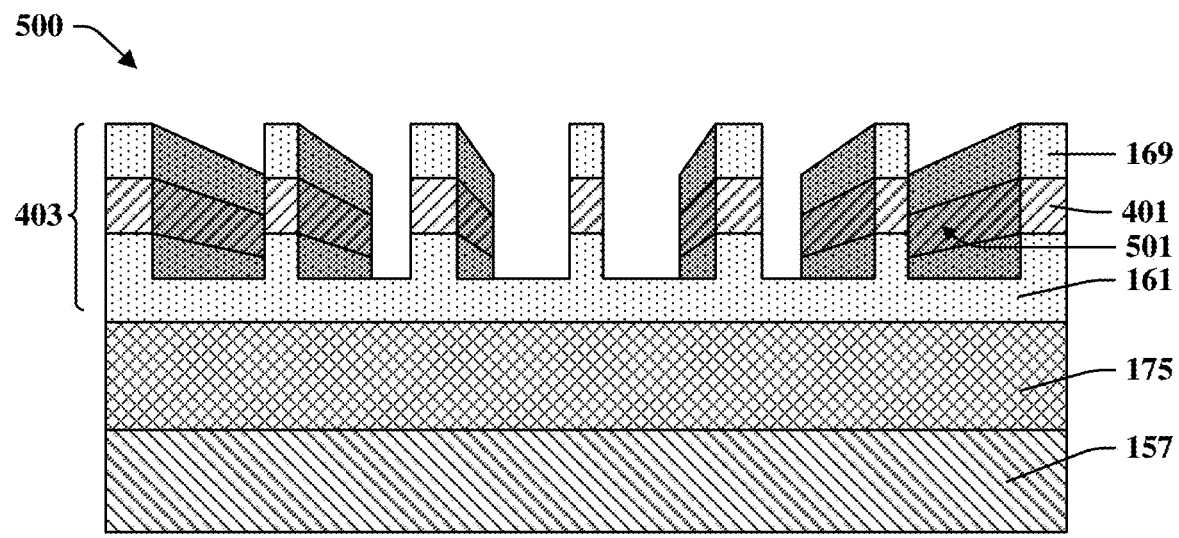
Figure 5B:
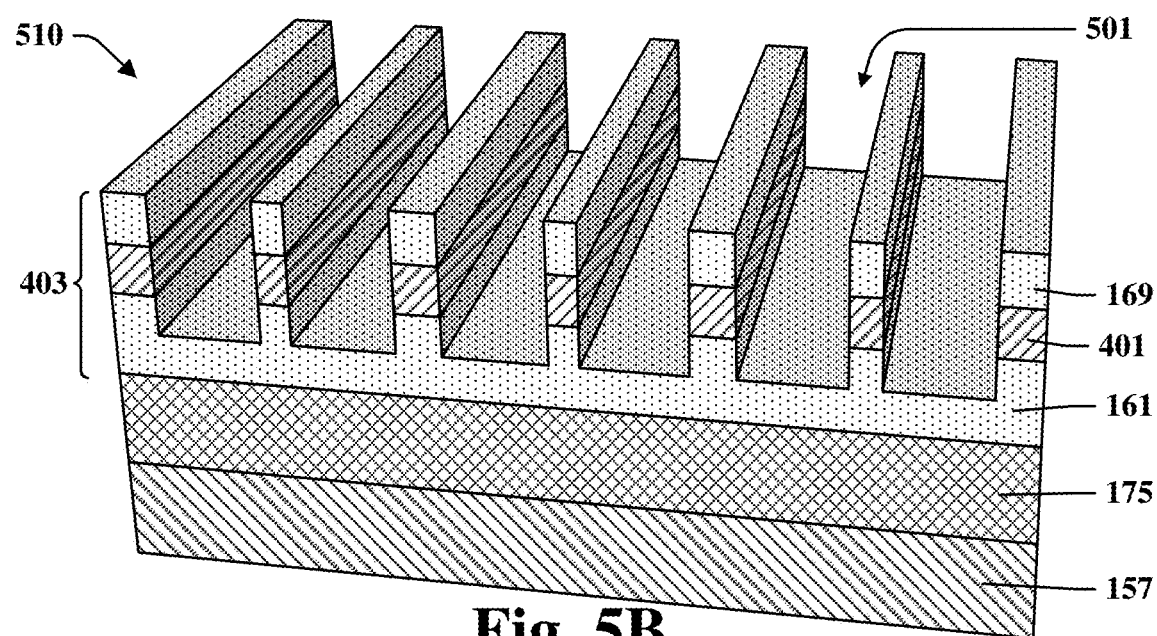

As show by the cross-sectional view 500 of FIG. 5A and the perspective view 510 of FIG. 5B, trenches 501 may be etched into the multilayer stack 403. Forming the trenches 501 into the multilayer stack 403 may comprise photolithography and plasma etching. The etching may proceed part way or all the way through the lower dielectric layer 161. Optionally, an etch stop layer is provided to limit a depth of the trenches 501.

Figure 6A:
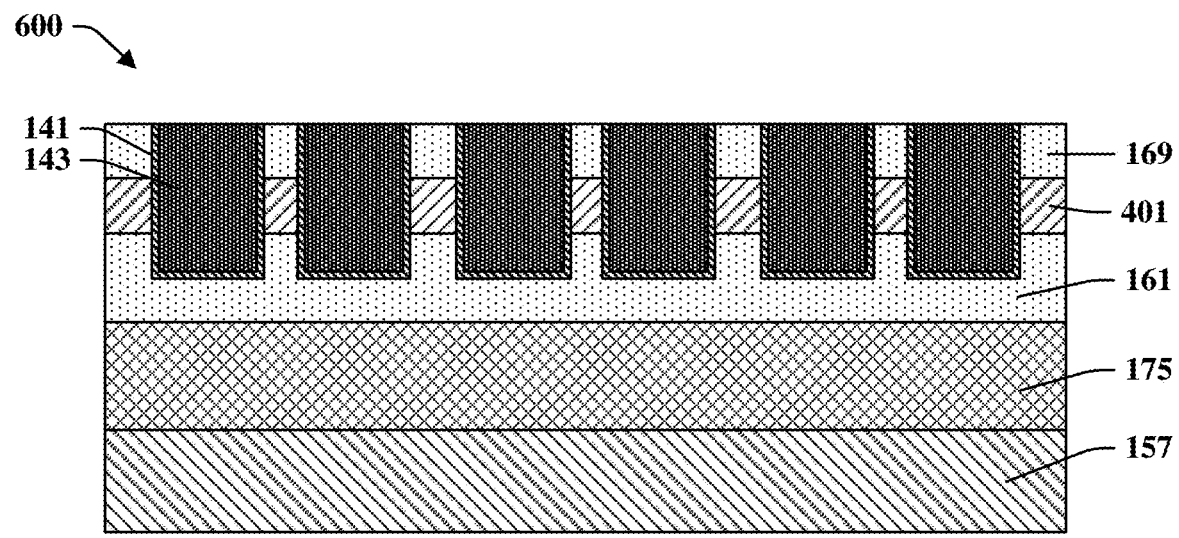
Figure 6B:
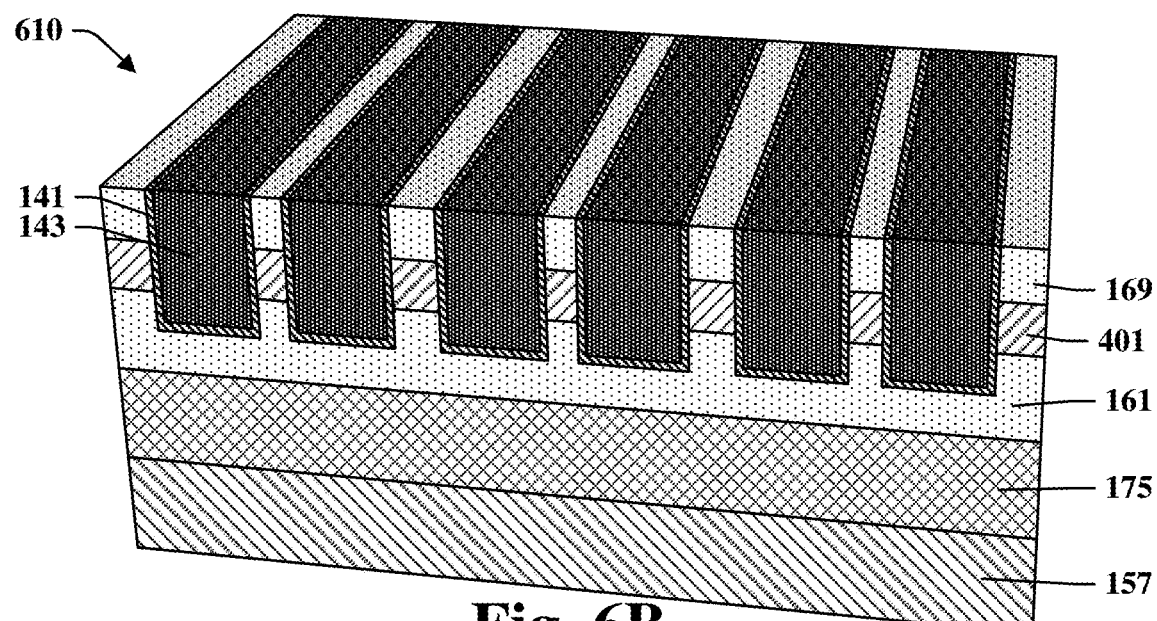

As show by the cross-sectional view 600 of FIG. 6A and the perspective view 610 of FIG. 6B, the trenches 501 are filled with conductive material to form WLs 143. In some embodiments, the filling of the trenches 501 begins with deposition of the liner 141. The liner 141 may be formed by chemical vapor deposition (CVD), physical vapor deposition (PVD), atomic layer deposition (ALD), or the like. The remaining fill may be any conductive material. Conductive materials that may be used include doped semiconductor materials (e.g., p-doped or n-doped polysilicon), carbon-based conductive materials, or metals. A carbon-based conductive material may be graphene, nano-crystalline graphite, or the like, and may be suitable for use without the liner 141. A metal may be titanium nitride (TiN), tantalum nitride (TaN), tungsten (W), copper (Cu), another CMOS contact metal, or the like. The conductive material may be deposited by CVD, PVD, electroplating, electroless plating, or the like. After filling the trenches 501, excess material may be removed by chemical mechanical polishing (CMP) or the like.

Figure 7A:
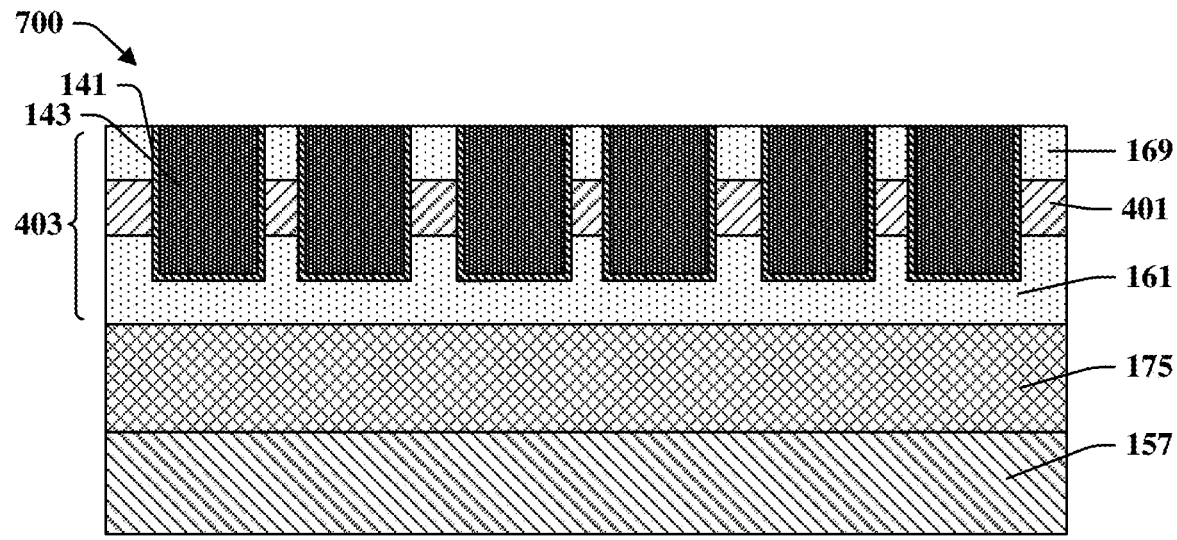
Figure 7B:
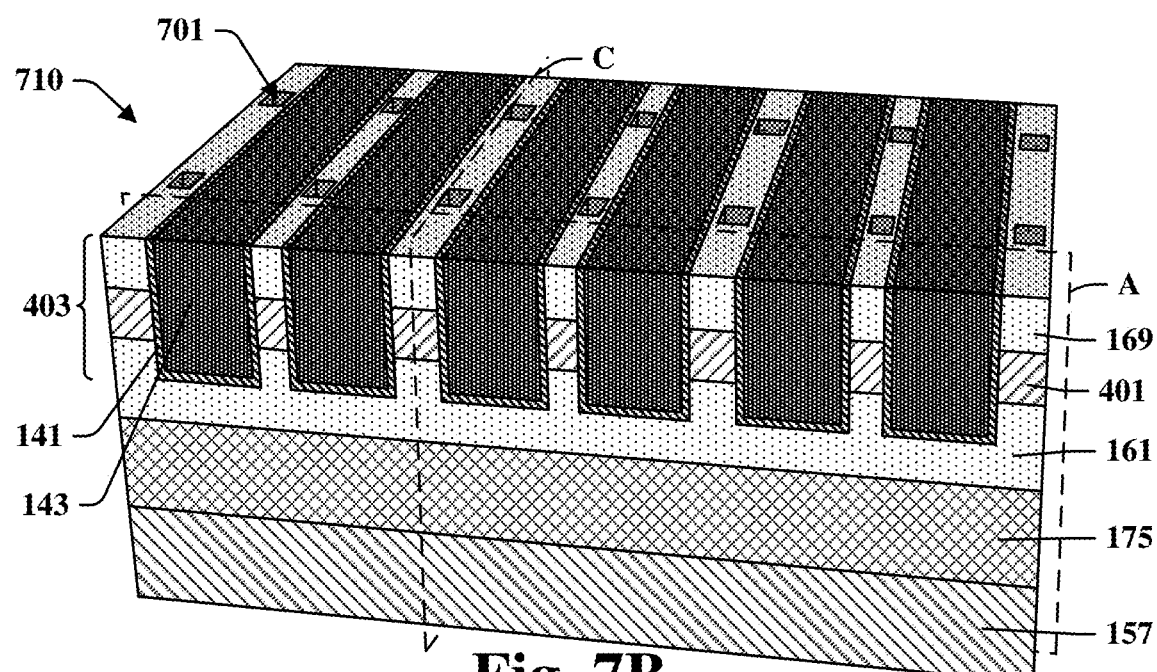
Figure 8A:
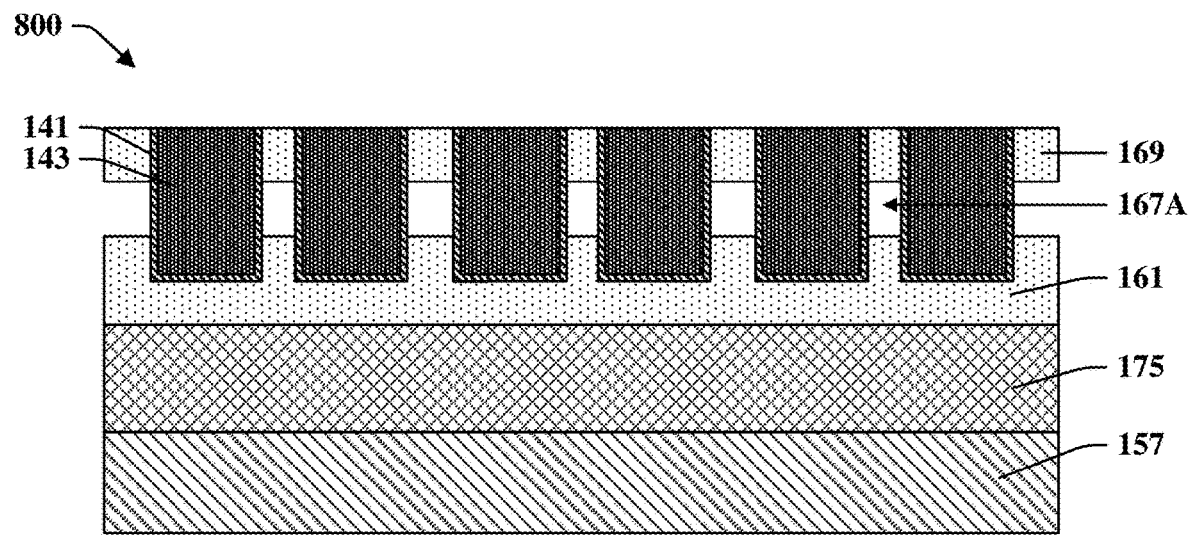
Figure 8B:
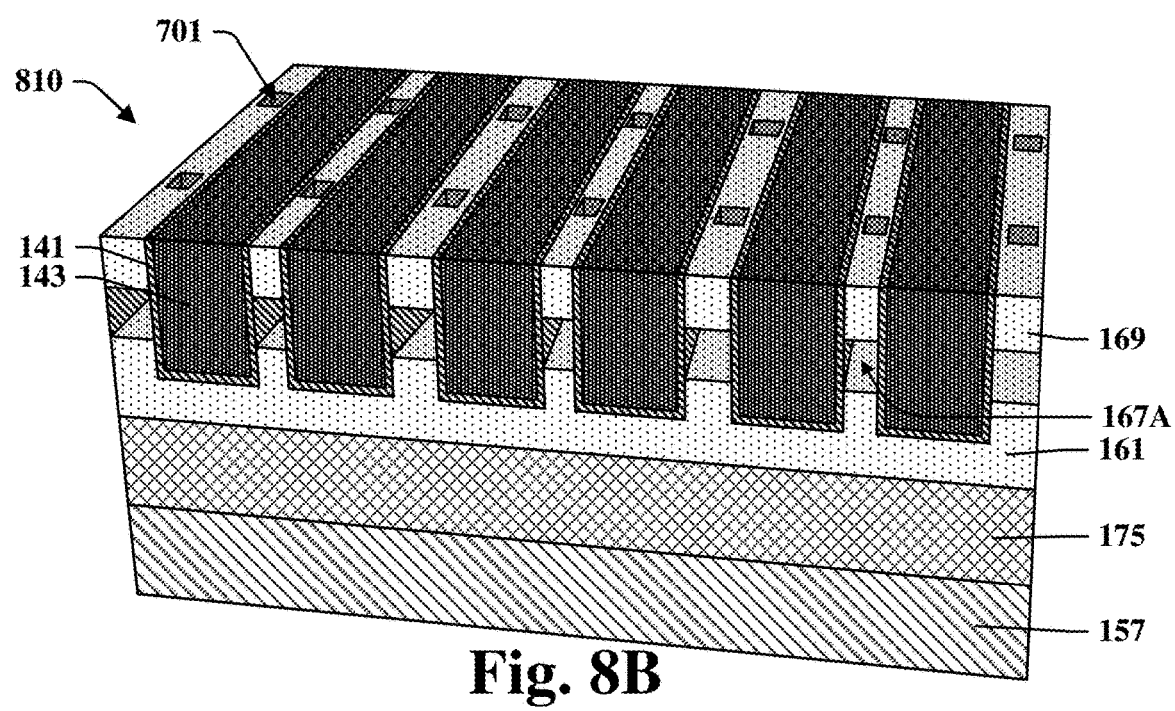

As show by the cross-sectional view 700 of FIG. 7A and the perspective view 710 of FIG. 7B, openings 701 are etched into the multilayer stack 403. The openings 701 pass through the upper dielectric layer 169 and have sufficient depth to expose the sacrificial layer 401. Forming the openings 701 may comprise photolithography and an etching process such as plasma etching. As show by the cross-sectional view 800 of FIG. 8A and the perspective view 810 of FIG. 8B, all or part of the sacrificial layer 401 may be etched away through the openings 701 to form the cavities 167A. Etching away all or part of the sacrificial layer 401 may comprise a wet etch. In some embodiments, hot phosphoric acid ($H_3PO_4$) or the like is used for the wet etch.

Figure 9A:
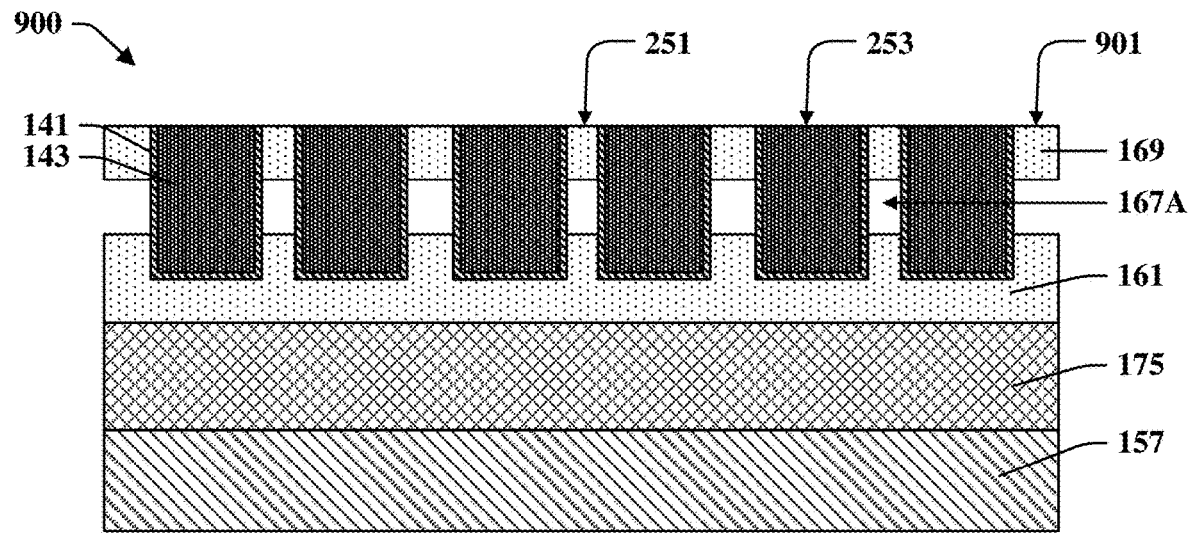
Figure 9B:
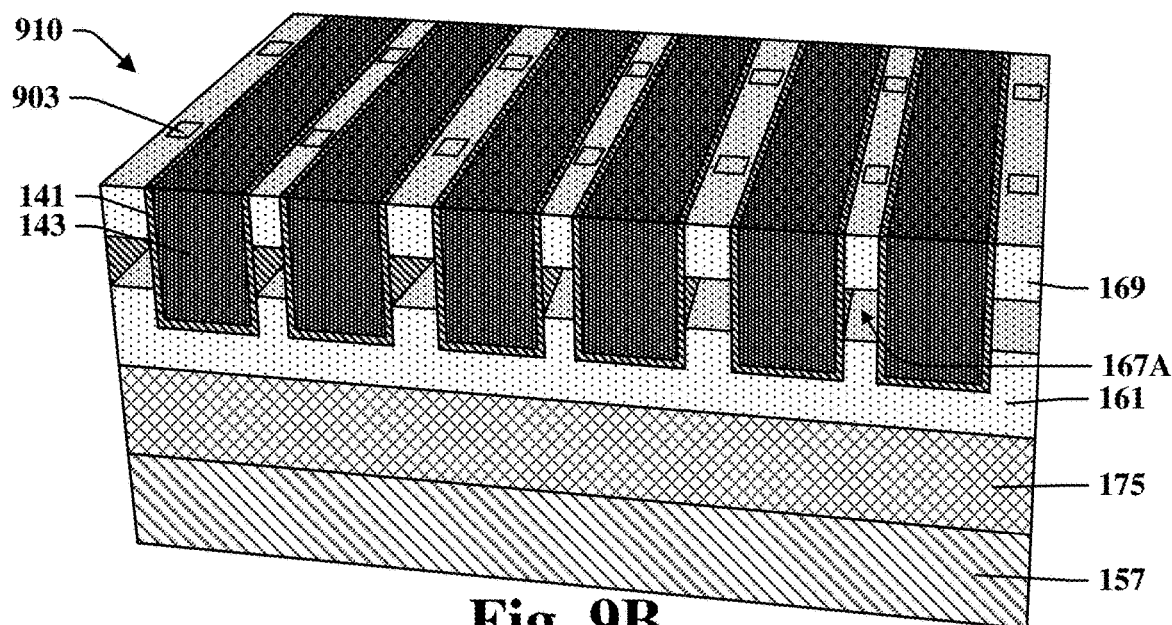

As show by the cross-sectional view 900 of FIG. 9A and the perspective view 910 of FIG. 9B, after the sacrificial layer 401 has been etched, the openings 701 may be filled with dielectric 903. In some embodiments, the dielectric 903 is the same dielectric as the upper dielectric layer 169. The dielectric 903 does not extend beyond an immediate vicinity of the openings 701 and fills at most a small portion of the cavities 167A. The dielectric 903 may be deposited by CVD, PVD, the like, or any other suitable process. After deposition, CMP may be carried out to planarize the upper surface 901 that comprises the upper surface 251 of the upper dielectric layer 169 and the upper surfaces 253 of the WLs 143.

Figure 10A:
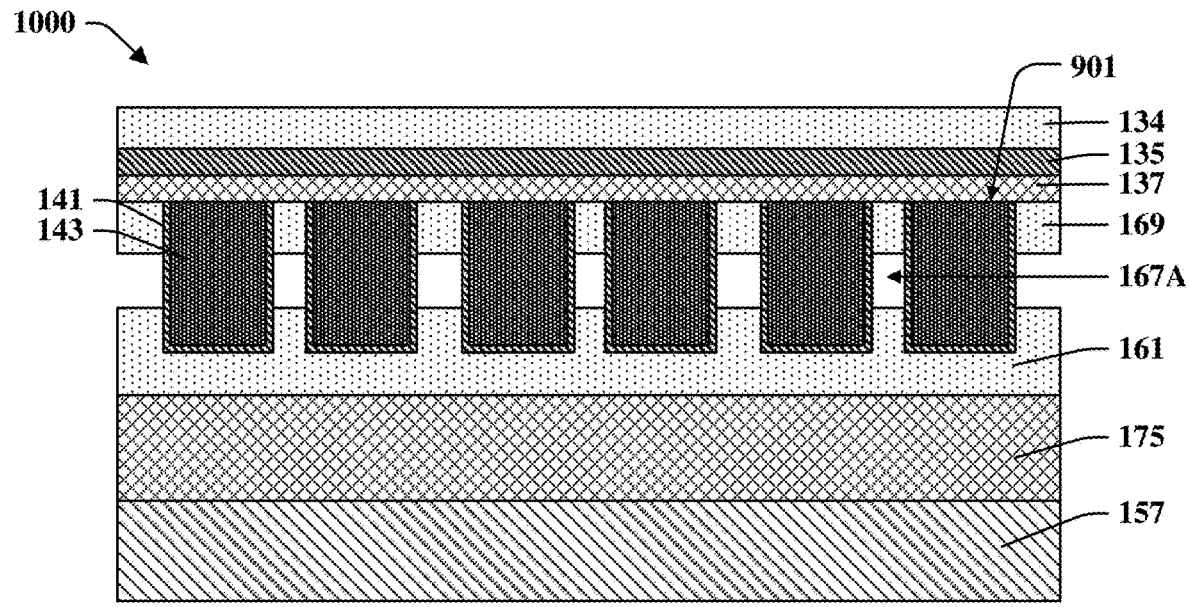
Figure 10B:
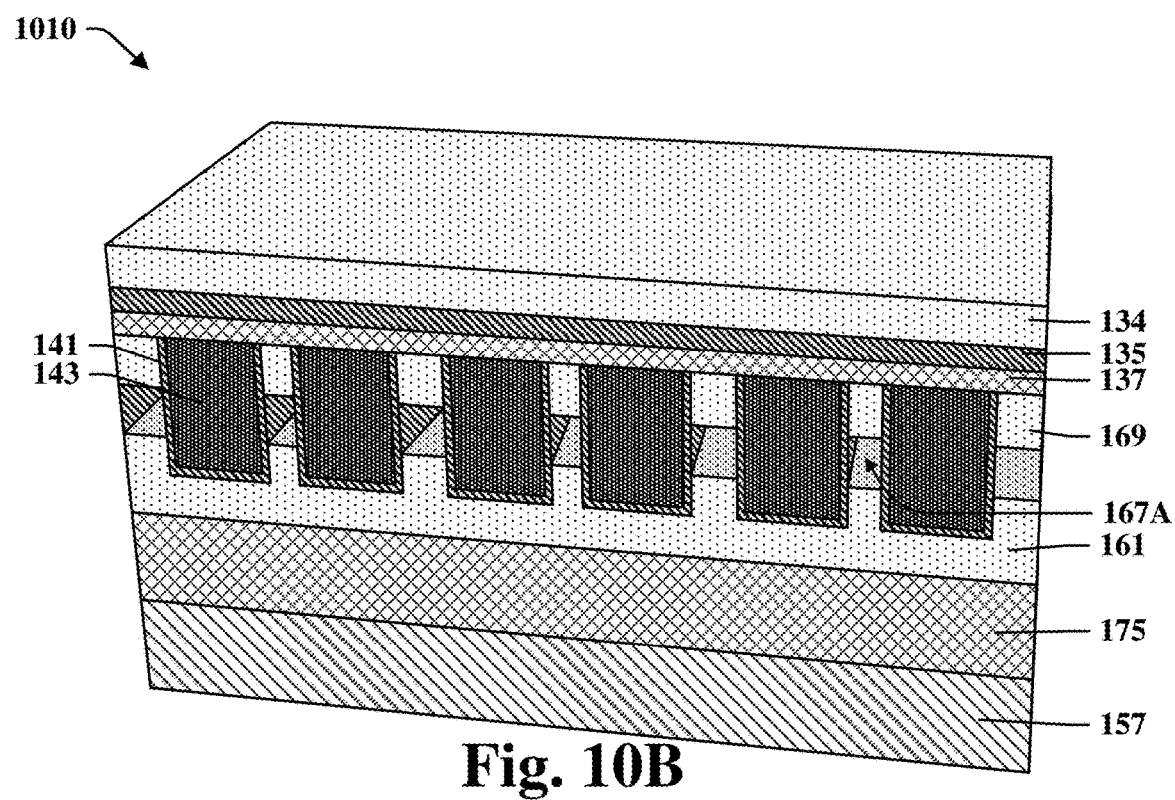

As show by the cross-sectional view 1000 of FIG. 10A and the perspective view 1010 of FIG. 10B, a series of layers may be deposited over the planar upper surface 901. These layers may include the gate dielectric layer 137, the channel layer 135, and an interlevel dielectric (ILD) layer 134. Each of these layers may be formed by CVD, PVD, ALD, a combination thereof, or the like.

The gate dielectric layer 137 may include one or more layers that provide a suitable gate dielectric structure for the BEOL transistors 139. In some embodiments, the gate dielectric layer 137 includes a high-κ dielectric. For example, the gate dielectric layer 137 may comprise aluminum oxide ($Al_2O_3$), hafnium oxide ($HfO_2$), tantalum oxide ($Ta_2O_5$), zirconium oxide ($ZrO_2$), titanium oxide ($TiO_2$), strontium titanium oxide ($SrTiO_3$), a mixture thereof, or the like. In some embodiments, the gate dielectric layer 137 has a thickness in a range from about 1 nm to about 15 nm. In some embodiments, the gate dielectric layer 137 has a thickness in a range from about 1 nm to about 5 nm.

The channel layer 135 comprises a semiconductor. In some embodiments, the channel layer 135 comprises an oxide semiconductor. The oxide semiconductor may be, for example, indium gallium zinc oxide (IGZO), indium zinc oxide (IZO), indium tin oxide (ITO), indium titanium oxide (ITiO), or the like. In some embodiments, the channel layer 135 has a thickness in a range of from about 3 nm to about 50 nm. In some embodiments, the channel layer 135 has a thickness in a range of from 5 nm to about 30 nm. The ILD layer 134 may be, for example, an oxide, a low-κ dielectric, an extremely low-κ dielectric, or the like.

Figure 11A:
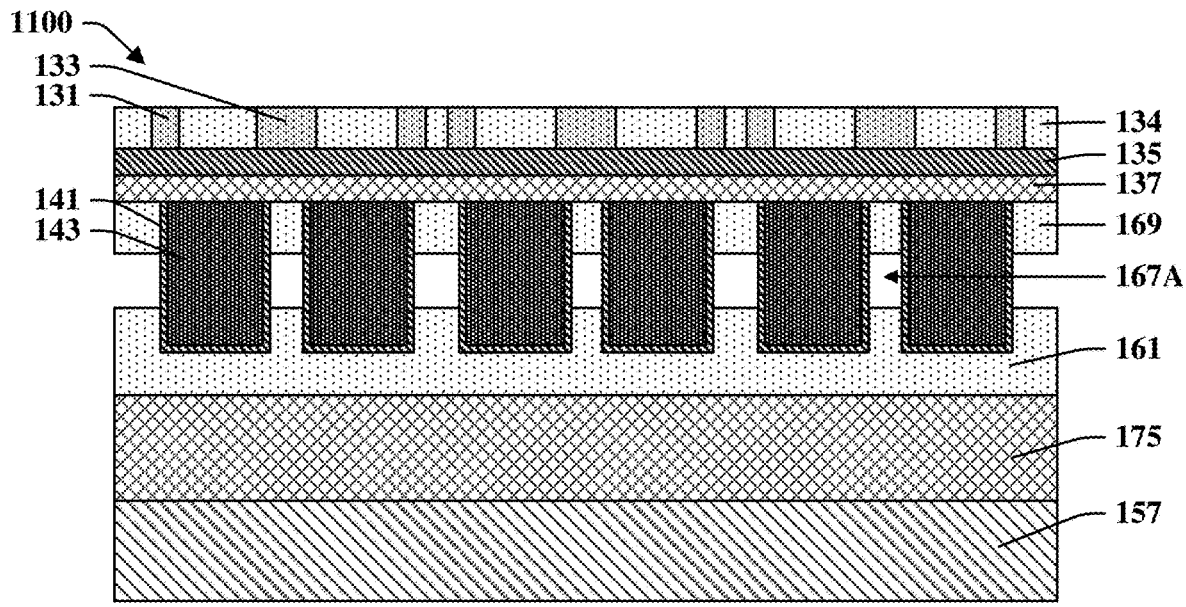
Figure 11B:
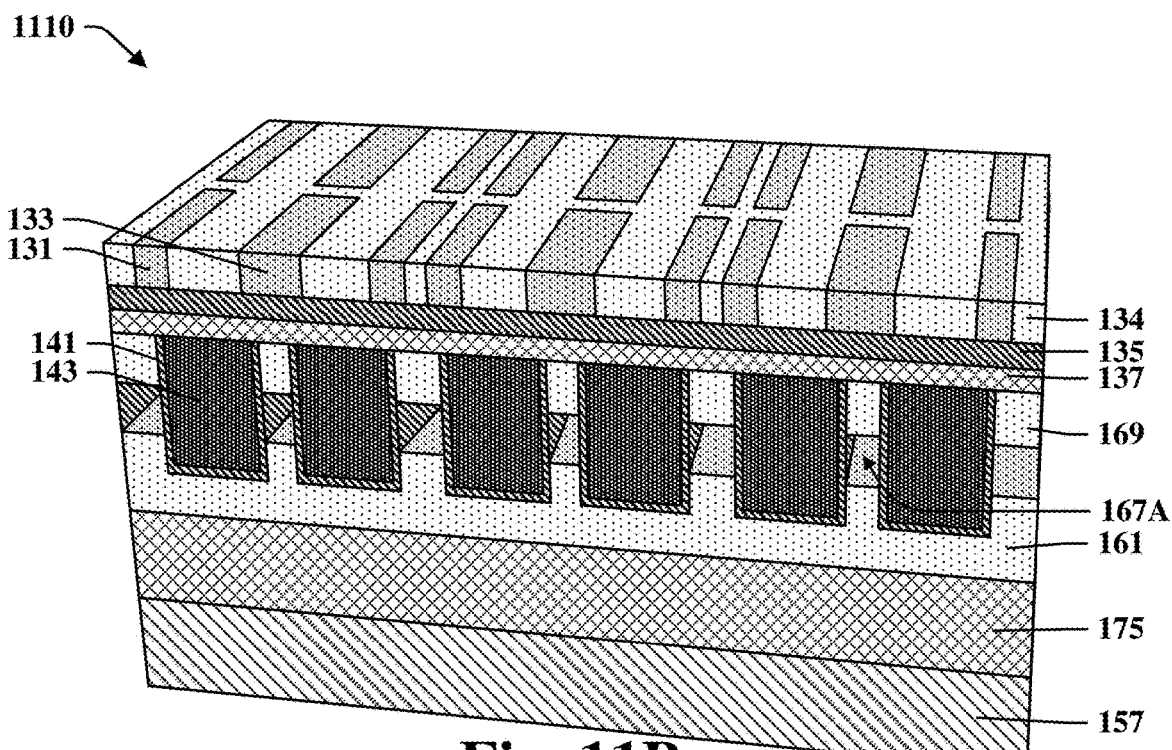

As show by the cross-sectional view 1100 of FIG. 11A and the perspective view 1110 of FIG. 11B, conductive islands are formed in the ILD layer 134 to provide the source regions 131 and the drain regions 133. In some embodiments, the source regions 131 and the drain regions 133 have thicknesses in a range of from about 1 nm to about 200 nm. In some embodiments, the conductive islands have thicknesses in a range of from about 10 nm to about 50 nm. In some embodiments, the conductive islands have lengths and widths in a range of from about 1 nm to about 200 nm. As shown by the illustrations, the drain regions 133 may be wider than the source regions 131. Forming the conductive islands may include photolithography to etch openings in the ILD layer 134, depositing a conductive material to fill the openings, and planarizing. The conductive material may be a doped semiconductor or a metal. The conductive material may be deposited by CVD, PVD, electroplating, electroless plating, the like, or any other suitable process.

Figure 12A:
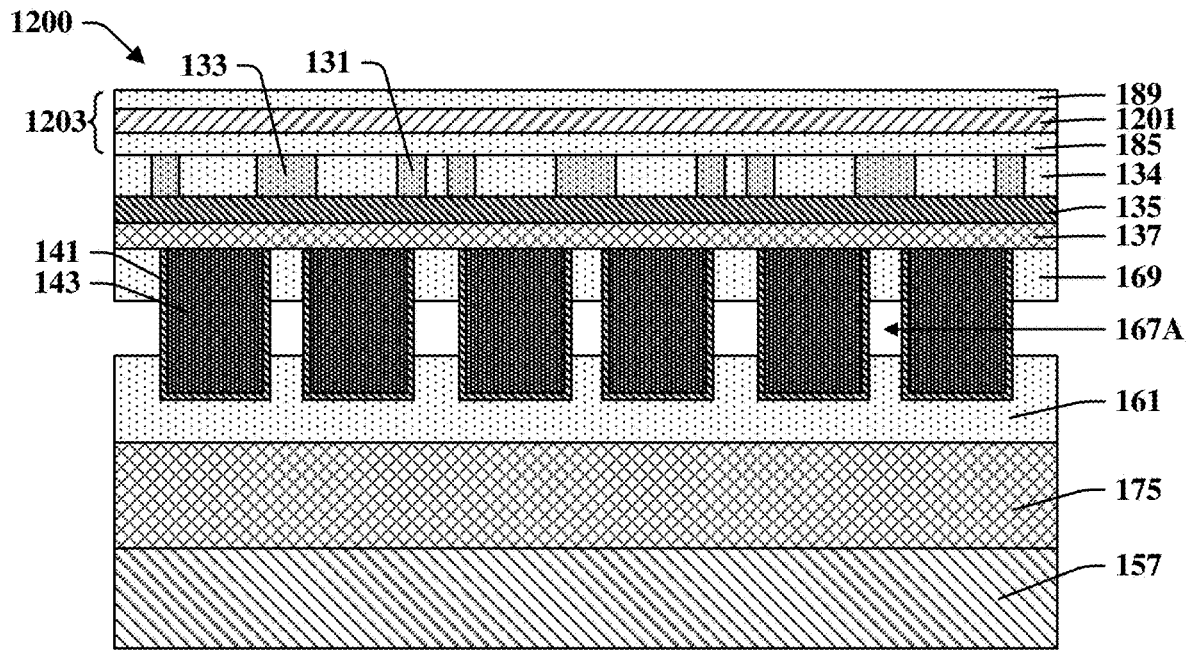
Figure 12B:
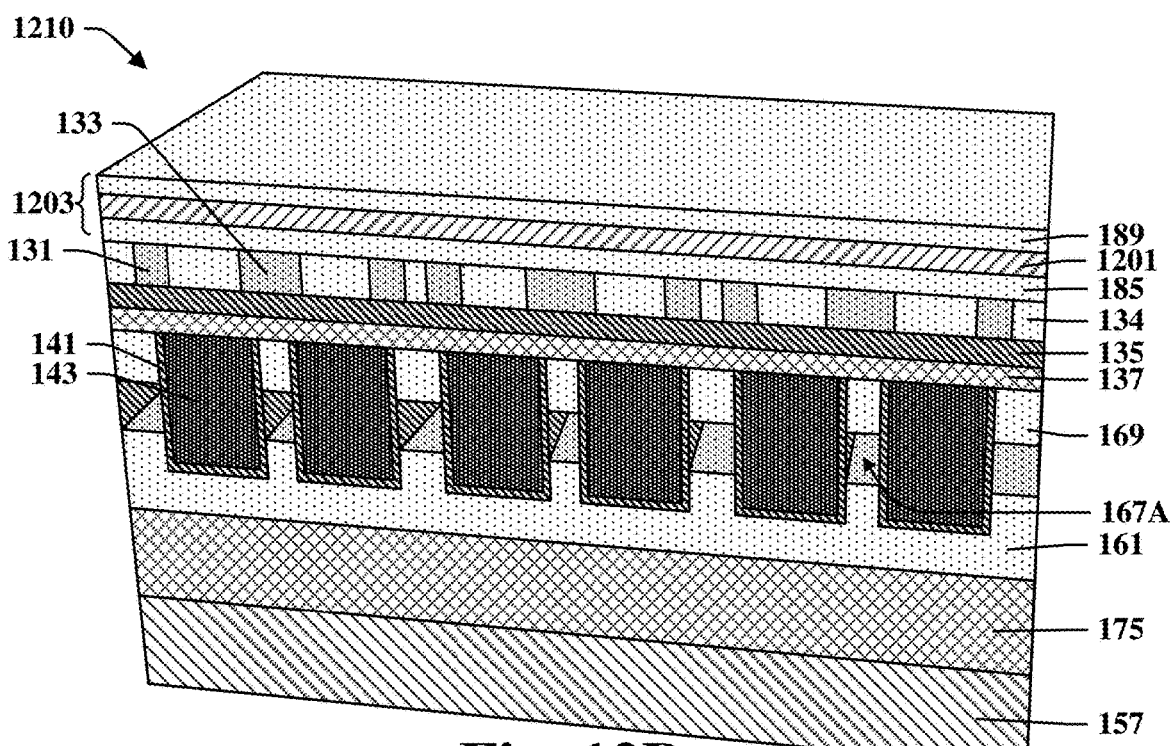

As show by the cross-sectional view 1200 of FIG. 12A and the perspective view 1210 of FIG. 12B a multilayer stack 1203 may be formed over the ILD layer 134, the source regions 131, and the drain regions 133. The multilayer stack 1203 include a lower dielectric layer 185, a sacrificial layer 1201, and an upper dielectric layer 189. Alternatives for selecting and forming these layers are the same as those for corresponding layers of the multilayer stack 403 as described above.

Figure 13A:
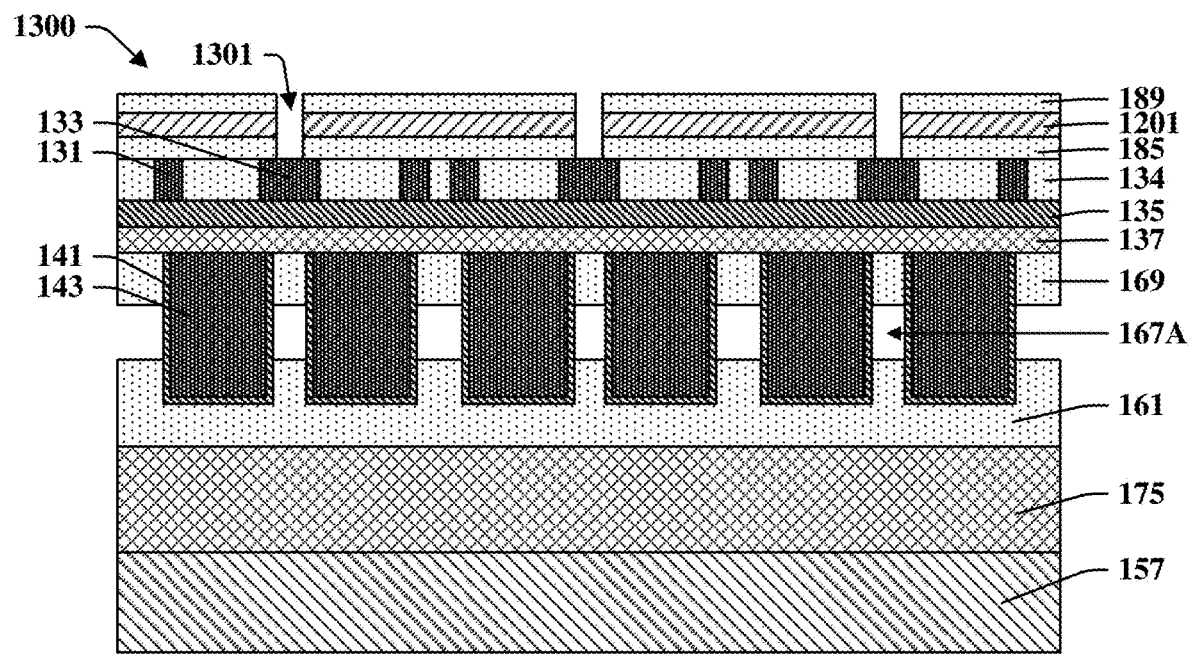
Figure 13B:
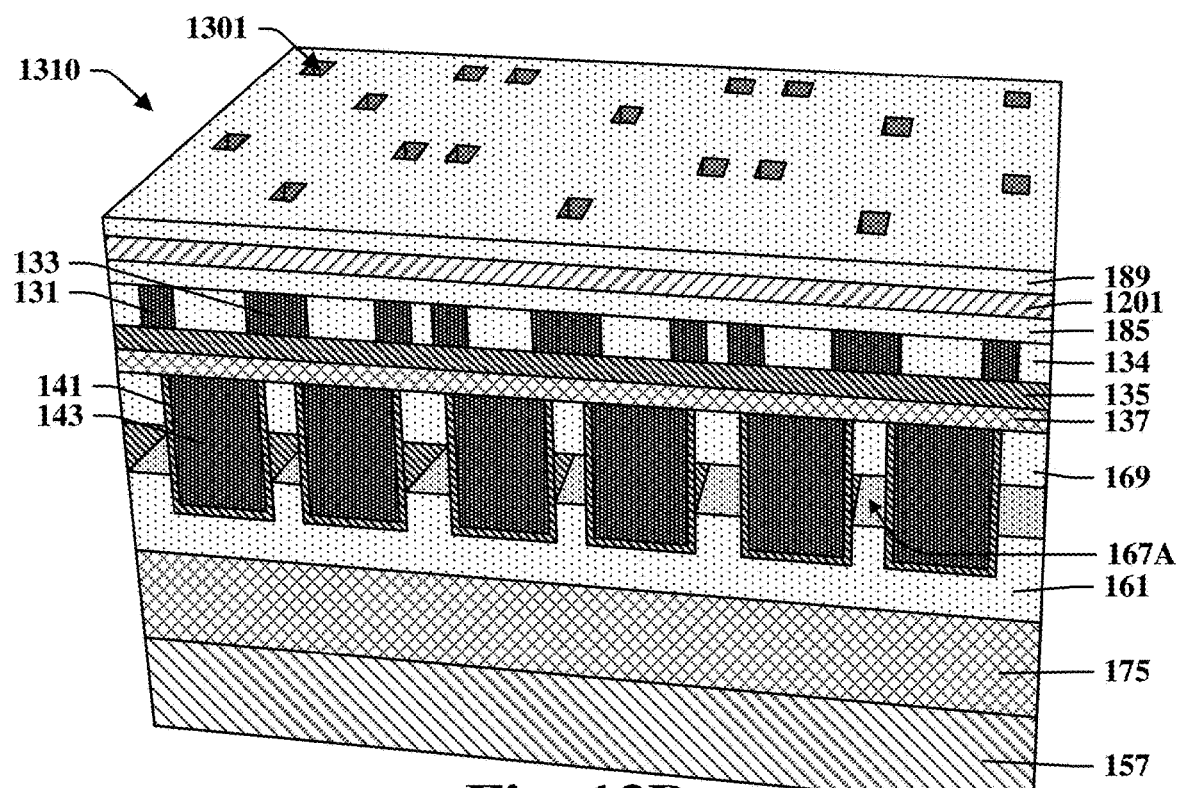

As show by the cross-sectional view 1300 of FIG. 13A and the perspective view 1310 of FIG. 13B, holes 1301 are etched through the multilayer stack 1203. Forming the holes 1301 may comprise photolithography and plasma etching. The holes 1301 variously open onto the source regions 131 and the drain regions 133.

Figure 14A:
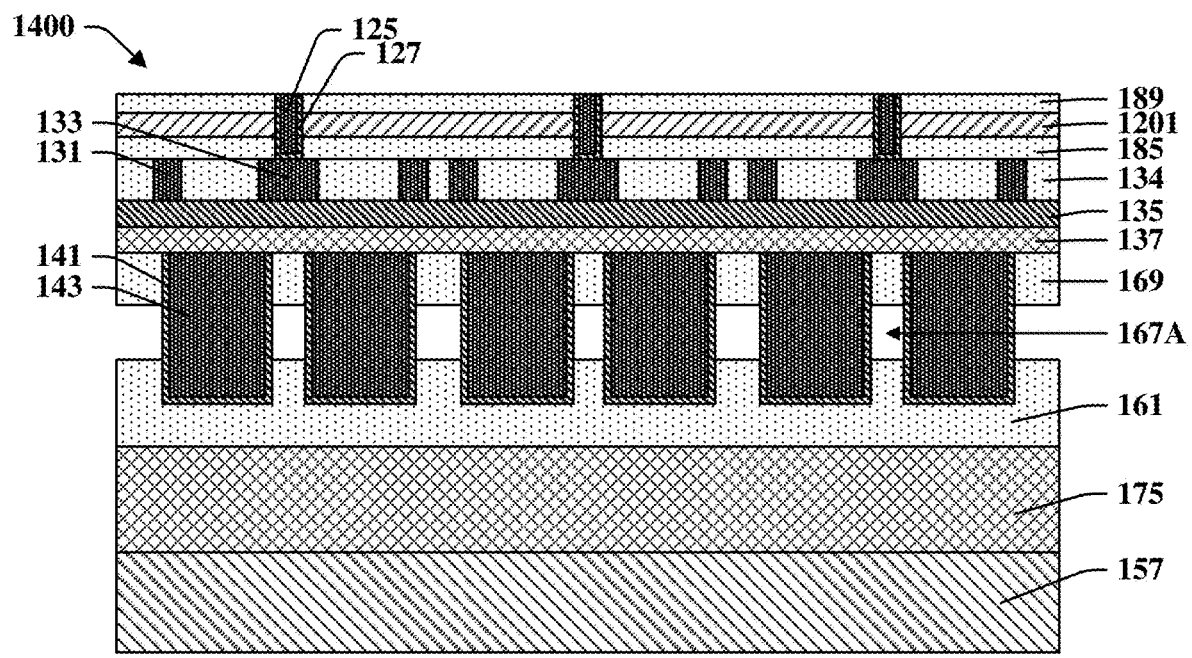
Figure 14B:
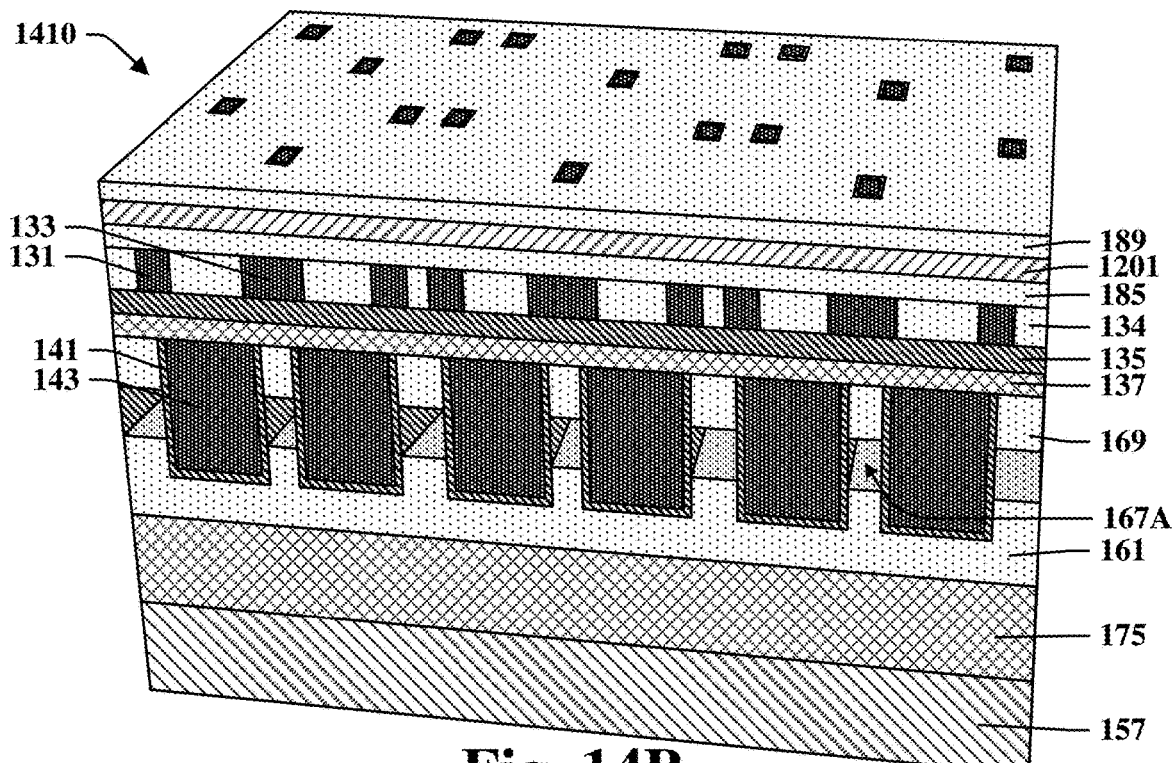

As show by the cross-sectional view 1400 of FIG. 14A and the perspective view 1410 of FIG. 14B, the holes 1301 are filled with conductive material to form vias 125. In some embodiments, the filling of the holes 1301 begins with the deposition of a liner 127. The liner 127 is optional and may be like the liner 141, which is also optional. The remaining fill may be a metal such as titanium nitride (TiN), tantalum nitride (TaN), tungsten (W), copper (Cu), or the like. The metal may be deposited by CVD, PVD, electroplating, electroless plating, or the like. After filling the holes 1301, excess material may be removed by chemical mechanical polishing (CMP) or the like.

Figure 15A:
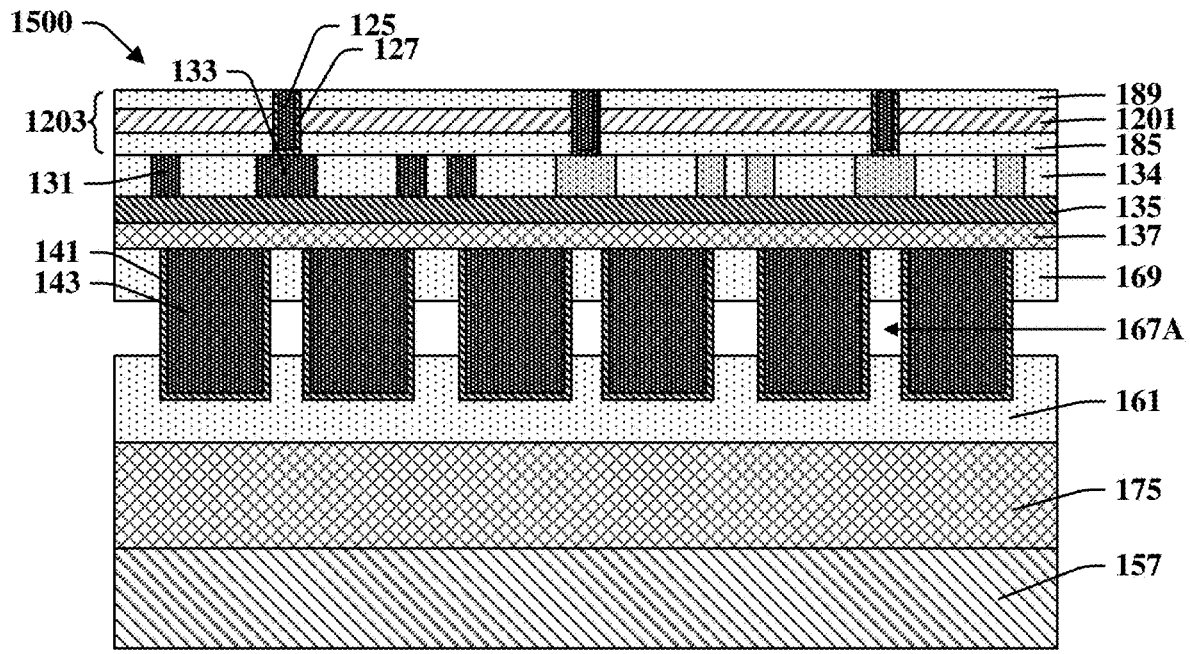
Figure 15B:
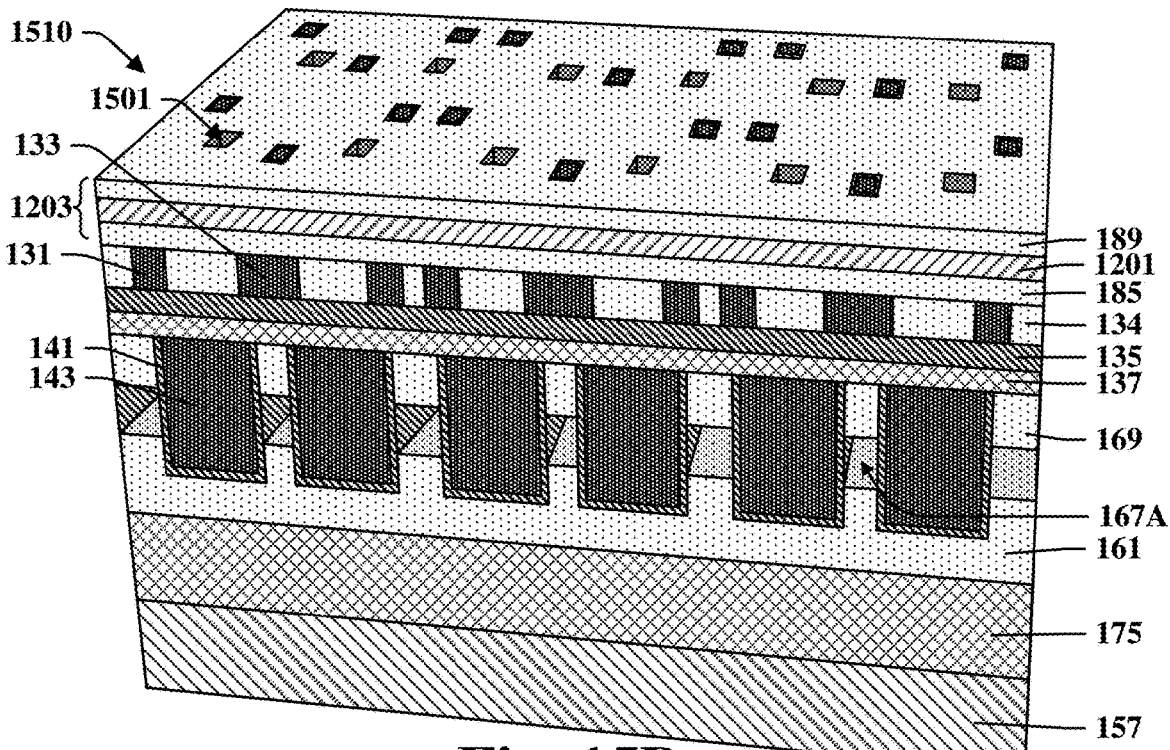

As show by the cross-sectional view 1500 of FIG. 15A and the perspective view 1510 of FIG. 15B, holes 1501 are etched in the multilayer stack 1203. The holes 1501 pass through the upper dielectric layer 189 and have sufficient depth to expose the sacrificial layer 1201. Forming the holes 1501 may comprise photolithography and an etching process such as plasma etching. As show by the cross-sectional view 1600 of FIG. 16A and the perspective view 1610 of FIG. 16B, all or part of the sacrificial layer 1201 may be etched away through the holes 1501 to form the cavities 187A. Etching away all or part of the sacrificial layer 1201 may comprise a wet etch. In some embodiments, hot phosphoric acid ($H_3PO_4$) is used for the wet etch. After the sacrificial layer 1201 has been etched, the holes 1501 may be filled with dielectric.

Figure 17A:
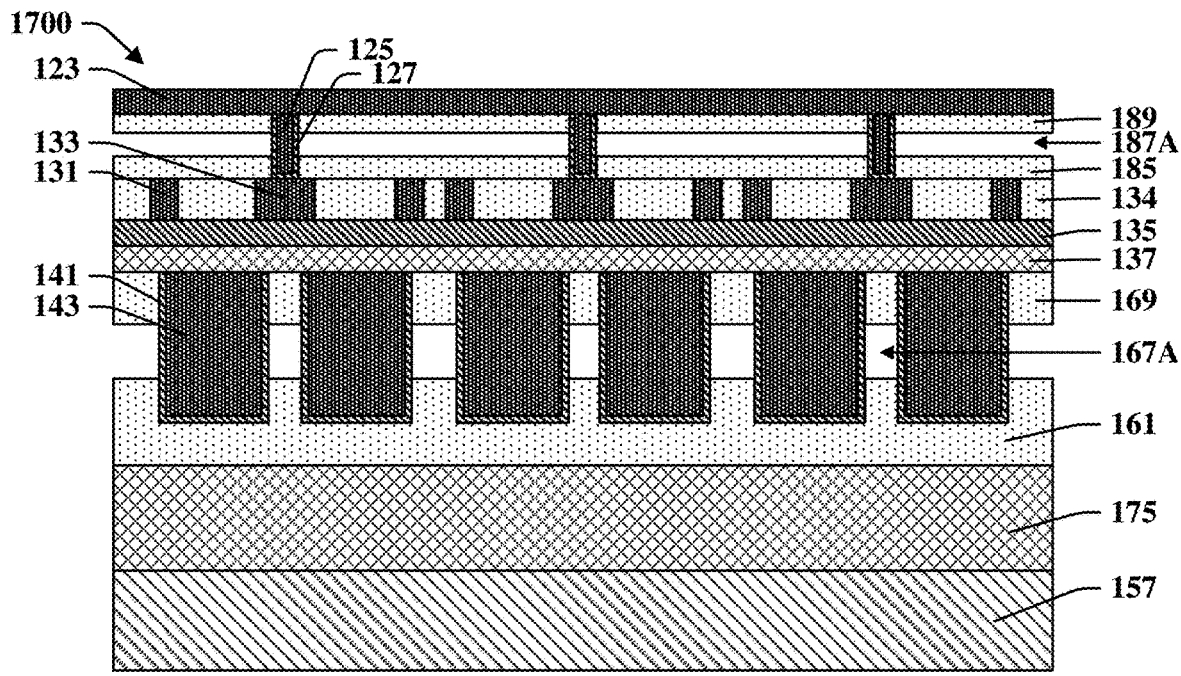
Figure 17B:
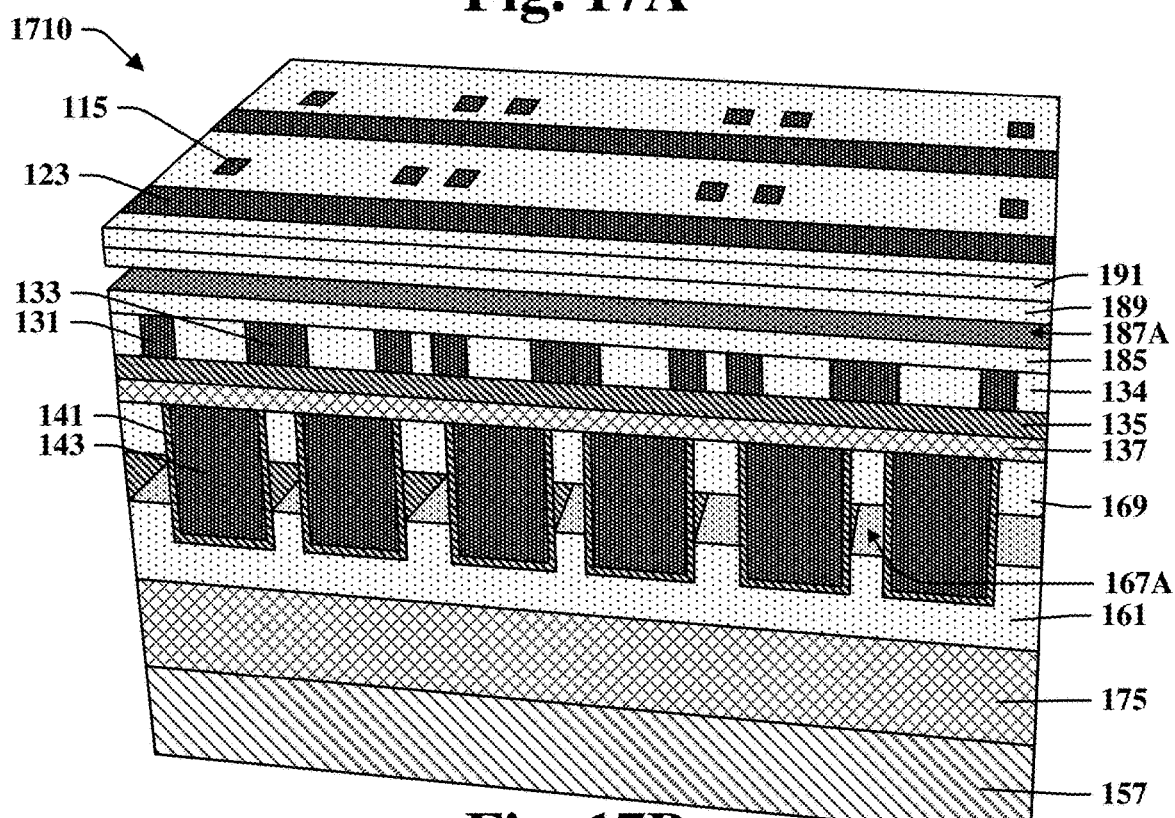

As show by the cross-sectional view 1700 of FIG. 17A and the perspective view 1710 of FIG. 17B, a metallization layer including BLs 123 and vias 115 may be formed over the upper dielectric layer 189. Forming this metallization layer may include depositing the ILD layer 191, photolithography to form trenches and holes in the ILD layer 191, filling the trenches and holes with conductive material, and planarizing to remove excess material.

The cross-sectional views of FIGS. 4A and 4B through 9A and 9B and the views of FIGS. 12A and 12B through FIGS. 17A and 17B provide examples of forming a dielectric structure comprising cavities in accordance with the present teachings. FIGS. 18-21 are a series of cross-sectional views showing additional details and alternatives applicable to forming these and other dielectric structures in accordance with the present teachings.

Figure 18:
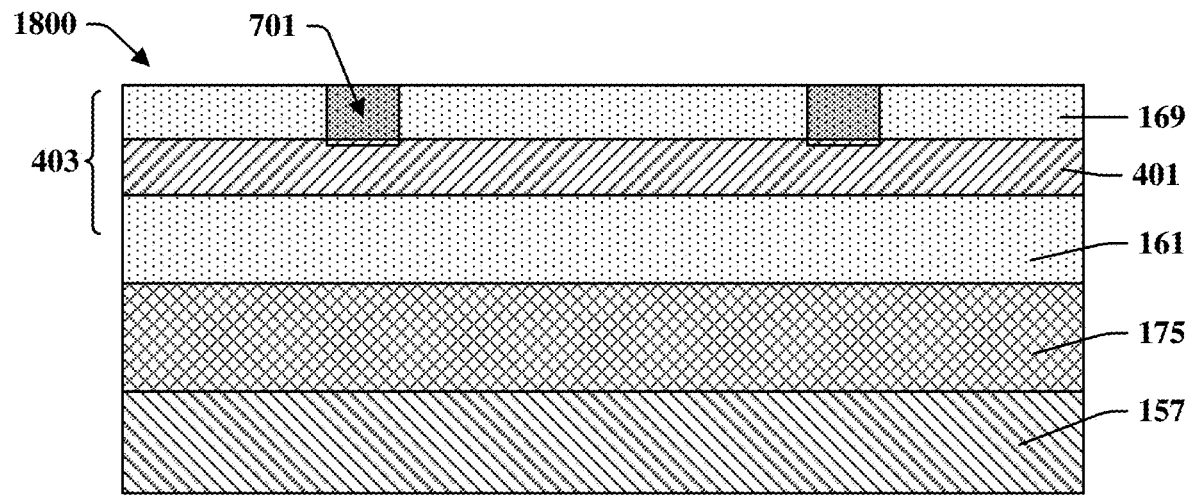
FIGS. 18-21 are a series of cut-away side view illustrations further exemplifying part of the method of FIGS. 4A and 4B through 17A and 17B.

FIG. 18 provides a cross-sectional view 1800 that may correspond specifically to the plane C of FIG. 7B. As shown by FIG. 18, the openings 701 may stop on or in the sacrificial layer 401. However, it should be appreciated that the multilayer stack 403 may include additional interleaved dielectric and sacrificial layers. The openings 701 may be given sufficient depth such that all the sacrificial layers may be etched through the openings 701.

Figure 19:
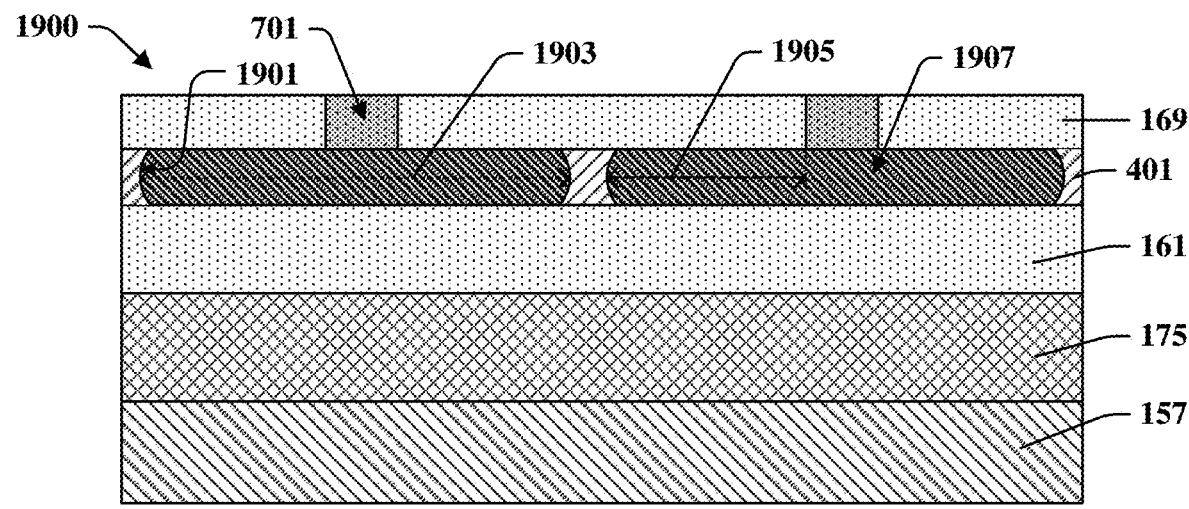

As shown by the cross-sectional view 1900 of FIG. 19 etching the sacrificial layer 401 through the openings 701 forms the cavities 1907. The etching may only partially remove the sacrificial layer 401, whereby portions of the sacrificial layer 401 remain to form side edges 1901 of the cavities 1907. The remaining portion of the sacrificial layer 401 has an area less than an area of the upper dielectric layer 169. In some embodiments, the remaining portion of the sacrificial layer 401 has an area half or less than an area of the upper dielectric layer 169. In some embodiments, the remaining portion of the sacrificial layer 401 has an area one fourth or less than an area of the upper dielectric layer 169. If the remaining area is too great, capacitance may be too high. If the remaining area is too little, an etch time may be too long.

A distance 1905 of the side edges 1901 from the opening 701 may be controlled by varying the etching time. A width 1903 of the cavities 1907 may be controlled by both the etching time and through the number and spatial distribution of the openings 701. In some embodiments, limiting the width 1903 by etching less than the entire sacrificial layer 401 results in a lower capacitive coupling than if the entire sacrificial layer 401 were etched away. In some embodiments, the width 1903 is in the range from about 10 nm to about 100 nm. In some embodiments, the width 1903 is less than about 50 nm. In some embodiments where a portion of the sacrificial layer 401 is allowed to remain, the sacrificial layer 401 is a dielectric having a dielectric constant no greater than that of silicon nitride (SiN).

Figure 20:
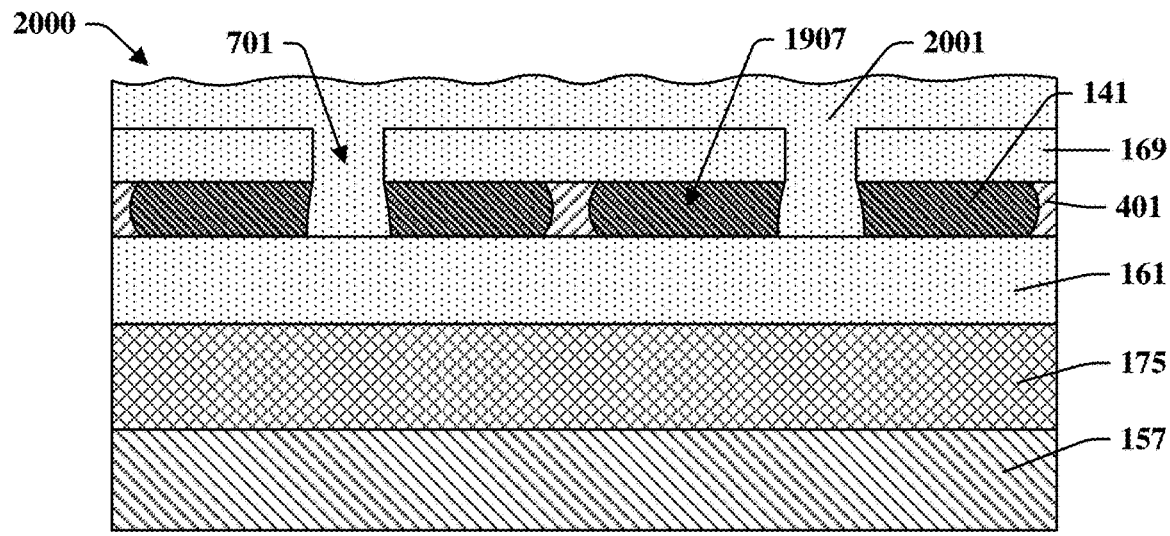

As shown by the cross-sectional view 2000 of FIG. 20, a dielectric 2001 may be deposited to close off the openings 701. The dielectric 2001 may fill a portion of the cavity 1907 immediately below the openings 701. The upper dielectric layer 169 is spaced apart from the lower dielectric layer 161, but the distance between the two may be bridged by the dielectric 2001. The amount of the cavity 1907 that is filled by the dielectric 2001 may be reduced by depositing the dielectric 2001 with a non-conformal deposition process. A non-conformal deposition process may be a CVD or PVD process carried out at a high rate. As shown by the cross-sectional view 2100 of FIG. 21, a planarization process such as CMP may be carried out to provide a planar upper surface 901. The planarization process may completely remove the dielectric 2001 from over the upper dielectric layer 169 or may leave a layer of the dielectric 2001 over the upper dielectric layer 169.

Figure 21:
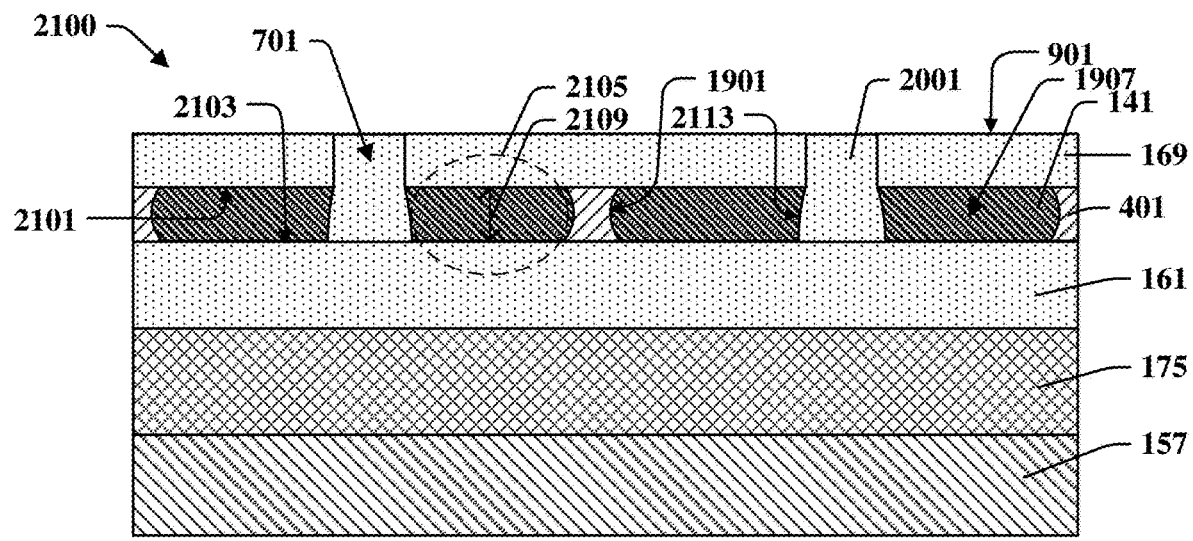

As further shown by the cross-sectional view 2100 of FIG. 21, after the cavities 1907 are sealed the cavities 1907 may have side edges that include one or more of side edges 1901 formed by a remaining portion of the sacrificial layer 401, side edges 2113 formed by the dielectric 2001, and additional side edges such as side edges formed by the liner 141. In areas 2105 that are away from these side edges, a height 2109 of the cavity 1907 is substantially constant. Within the areas 2105, a shape of the ceiling 2101 is conformal to a shape of the floor 2103. If the floor 2103 is flat, the ceiling 2101 is also flat. Making these surfaces flats facilitates providing a flat surface 901 over the upper dielectric layer 169.

In some embodiments, the openings 701 are from about 0.1% to about 50% an area of the upper dielectric layer 169. In some embodiments, the openings 701 are from about 0.5% to about 25% an area of the upper dielectric layer 169. In some embodiments, the openings 701 are from about 1% to about 10% an area of the upper dielectric layer 169. As can be seen from the cross-sectional view 2100 of FIG. 21 if the openings 701 have too high a density or are too large, a volume of the cavities 1907 may be excessively reduced due to filling of the cavities 1907 beneath the openings 701. If the openings 701 are too small or have too low a density, too much of the sacrificial layer 401 may remain after etching and the dielectric constant of the resulting structure may be too high.

In some embodiments, the openings 701 are distributed such that the distance 1905 (see FIG. 19) is from about one to about ten times the height 2109 of the cavity 1907. In some embodiments, the openings 701 are distributed such that the distance 1905 is from about two to about five times the height 2109 of the cavity 1907. In some embodiments, the openings 701 are distributed such that the distance 1905 is about three times or less the height 2109 of the cavity 1907. If the sacrificial layer 401 is completely removed by the etching, the distance 1905 is half the distance between adjacent openings 701. In other words, the distance 1905 measures a maximum lateral extent of the cavity 1907 from any of the openings 701. In some embodiments, the openings 701 have areas that are $(50 \text{ nm})^2$ or less. In some embodiments, the openings 701 have areas that are $(25 \text{ nm})^2$ or less.

Figure 22:
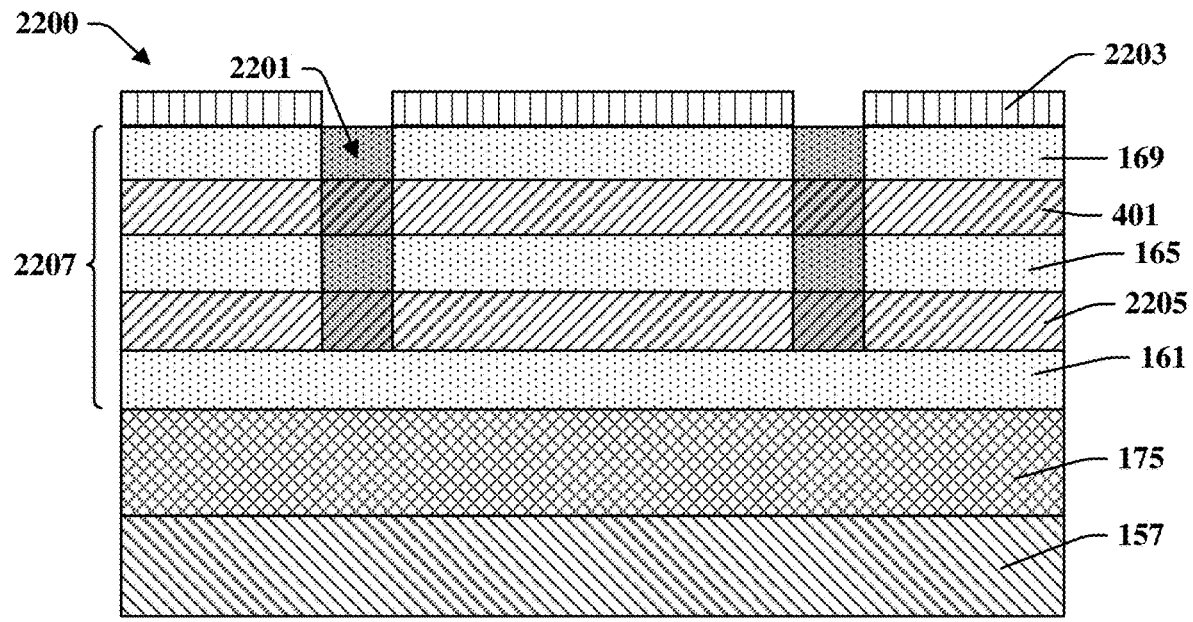
FIGS. 22-23 are side view illustrations exemplifying a variation on the method of FIGS. 18-21.
Figure 23:
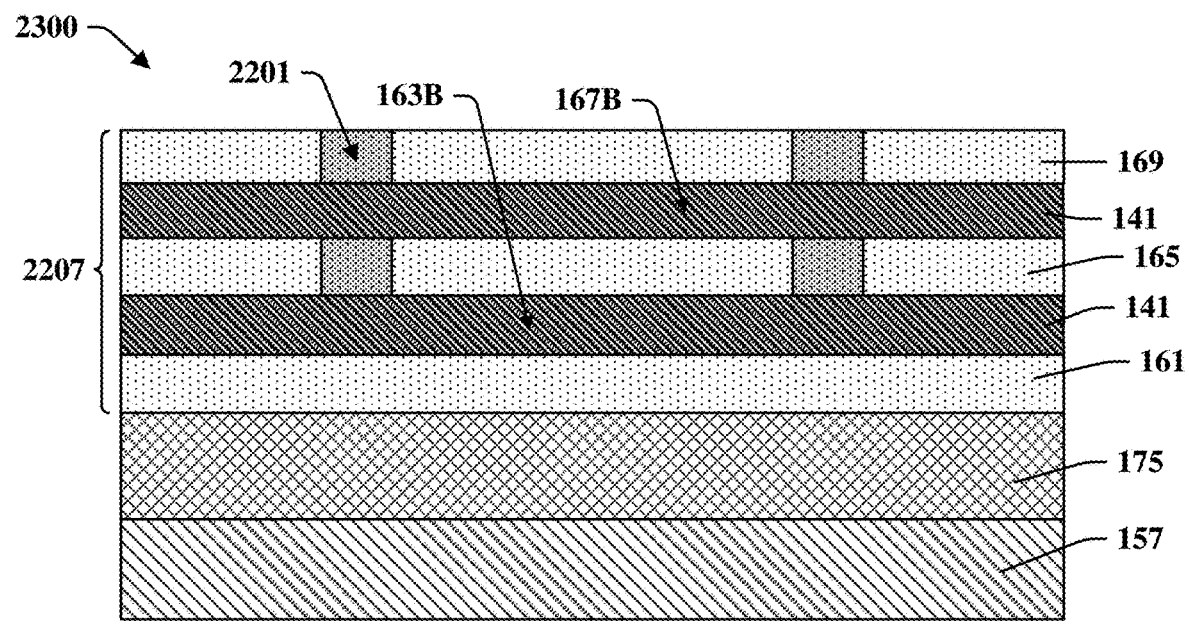

The cross-sectional views 2200 and 2300 of FIGS. 22 and 23 show a variation of the process shown by the cross-sectional views 1800-2100 of FIGS. 18 and 21. The variation may be used to form a dielectric structure such as the dielectric structure 181B of FIG. 1D. As shown in FIG. 22, a multilayer stack 2207 is like the multilayer stack 403 of FIG. 4 but includes the middle dielectric layer 165 and a lower sacrificial layer 2205. As further shown by the cross-sectional view 2200 of FIG. 22, a photoresist 2203 may be formed, patterned, and used to dry etch trenches 2201 in the multilayer stack 2207. The trenches 2201 extend at least to the top of the lower sacrificial layer 2205. In some embodiments, the trenches 2201 extend through the lower sacrificial layer 2205. Using dry etching to extend the trenches 2201 or the like through the lowest of the sacrificial layers may facilitate removing the sacrificial material by wet etching. As shown by the cross-sectional view 2300 of FIG. 23, the sacrificial layer 401 may be etched away through the trenches 2201 to form the cavity 167B and the sacrificial layer 2205 may be simultaneously etched away through the trenches 2201 to form the cavity 163B.

Figure 24:
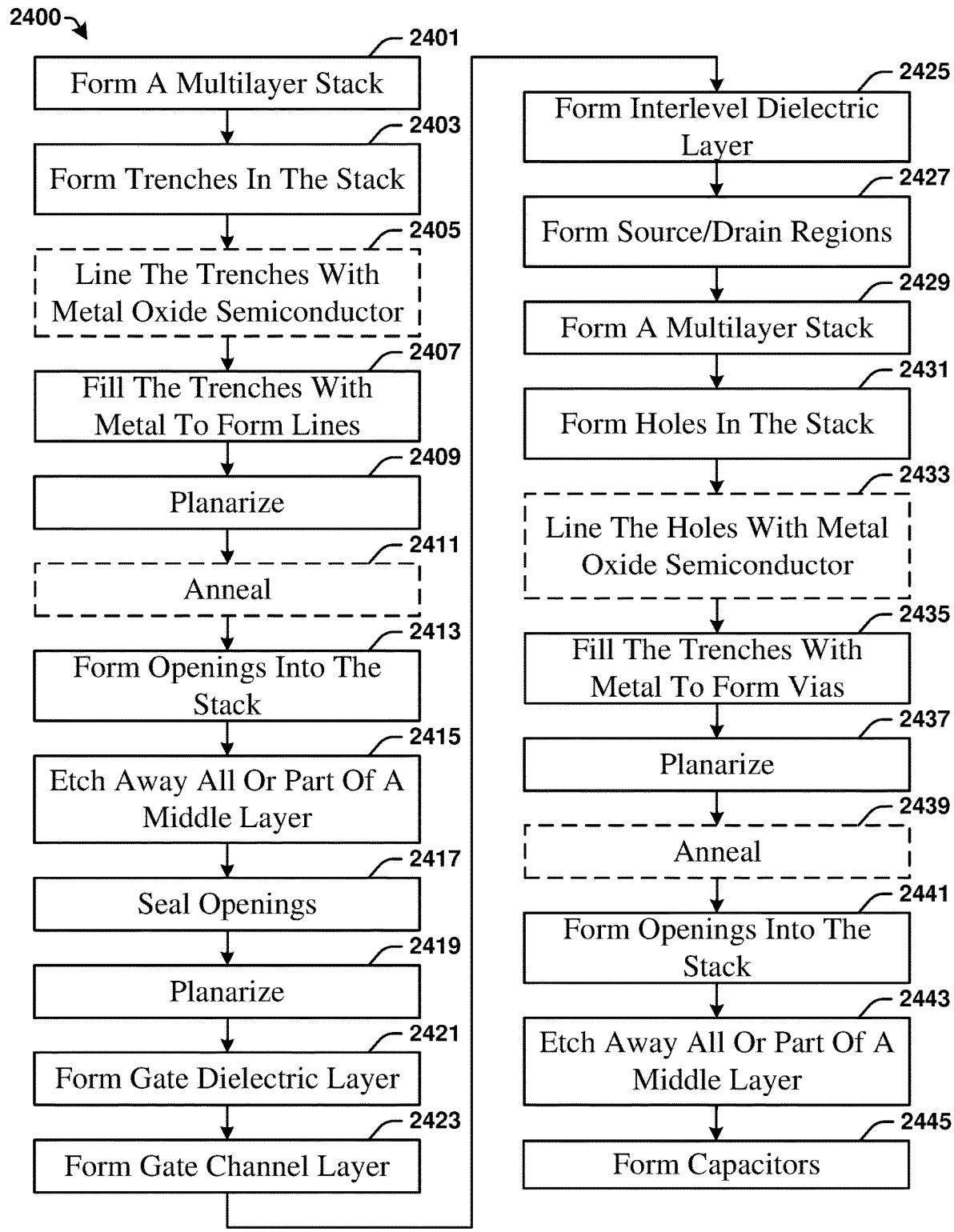
FIG. 24 provides a flow chart illustrating a method of forming an IC device including cavities according to the present teachings.

FIG. 24 presents a flow chart for a process 2400 which may be used to form an integrated circuit device according to the present disclosure. While the process 2400 of FIG. 24 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement some aspects of the present disclosure or the embodiments thereof, and one or more of the acts depicted may be carried out in one or more separate acts and/or phases.

The process 2400 may begin with act 2401, forming a multilayer stack. The multilayer stack includes an upper dielectric layer, a lower dielectric layer, and a sacrificial layer that is between the upper dielectric layer and the lower dielectric layer. The multilayer stack may include additional interleaved dielectric layers and sacrificial layers between the upper dielectric layer and the lower dielectric layer. The multilayer stack may be formed within a metal interconnect. The multilayer stack 403 in the cross-sectional view 400 of FIG. 4A, the multilayer stack 1203 in the cross-sectional view 1200 of FIG. 12A, and the multilayer stack 2207 in the cross-sectional view 2200 of FIG. 22 provide examples.

The process 2400 may continue with act 2403, forming trenches within the multilayer stack. The cross-sectional view 500 of FIG. 5A provides an example. There may follow act 2405, lining the trenches with an oxide semiconductor, act 2407, filling the trenches with metal or another conductive material to form conductive lines such as word lines, and act 2409, planarizing. The cross-sectional view 600 of FIG. 6A provides an example.

Act 2405, lining the trenches with an oxide semiconductor, is optional. When act 2405 is employed, act 2411 may also be employed. Act 2411 is annealing, which may be used to crystallize the oxide semiconductor and thereby increase its strength. In some embodiments, the annealing takes place at temperatures in the range from about 300° C. to about 500° C. In some embodiments, the annealing takes place at temperatures in the range from about 350° C. to about 450° C.

Act 2413 is forming openings into the multilayer stack. The openings have sufficient depth to expose the sacrificial layers within the multilayer stack. The perspective view 710 of FIG. 7B, the cross-sectional view 1800 of FIG. 18, and the cross-sectional view 2200 of FIG. 22 provide examples.

Act 2415 is etching to remove all or part of each of the sacrificial layers within the multilayer stack. The etch process may be a wet etch. The perspective view 810 of FIG. 8B, the cross-sectional view 1900 of FIG. 19, and the cross-sectional view 2300 of FIG. 23 provide examples.

Act 2417 is sealing the openings that were formed in act 2413. Sealing the openings may comprises depositing dielectric. The perspective view 910 of FIG. 9B and the cross-sectional view 2000 of FIG. 20 provide examples. Act 2419 is planarizing, which may be used to remove dielectric that deposits outside the openings during act 2417. The cross-sectional view 2100 of FIG. 21 provides an example.

Act 2421 is forming a gate dielectric layer over the dielectric structure formed over the preceding steps. Act 2423 is forming a channel layer over the gate dielectric layer. Act 2425 is forming an ILD layer over the channel layer. The perspective view 1010 of FIG. 10B provides an example.

Act 2427 is forming source and drain regions in the ILD layer. This may comprise etching openings through the ILD layer to expose the channel layer, filling the openings with a metal that contacts the channel layer, and planarizing. The perspective view 1110 of FIG. 11B provides an example.

Act 2429 is forming a second multilayer stack. The second multilayer stack also includes an upper dielectric layer, a lower dielectric layer, and a sacrificial layer between the upper dielectric layer and the lower dielectric layer. The perspective view 1210 of FIG. 12B provides an example. The second multilayer stack may also include additional interleaved dielectric layers and sacrificial layers between the upper dielectric layer and the lower dielectric layer.

Act 2431 is forming holes in the second multilayer stack. The perspective view 1310 of FIG. 13B provides an example. There may follow act 2433, lining the holes with an oxide semiconductor, act 2435, filling the holes with metal or another conductive material to form conductive vias, and act 2437, planarizing. The perspective view 1410 of FIG. 14B provides an example.

Act 2435, lining the holes with an oxide semiconductor, is optional. When act 2435 is employed, act 2437 may also be employed. Act 2439 is annealing, which may be used to crystallize the oxide semiconductor and thereby increase its strength. This is like act 2411.

Act 2441 is forming openings into the second multilayer stack. The openings have sufficient depth to expose the sacrificial layers within the second multilayer stack. The perspective view 1510 of FIG. 15B provides an example.

Figure 16A:
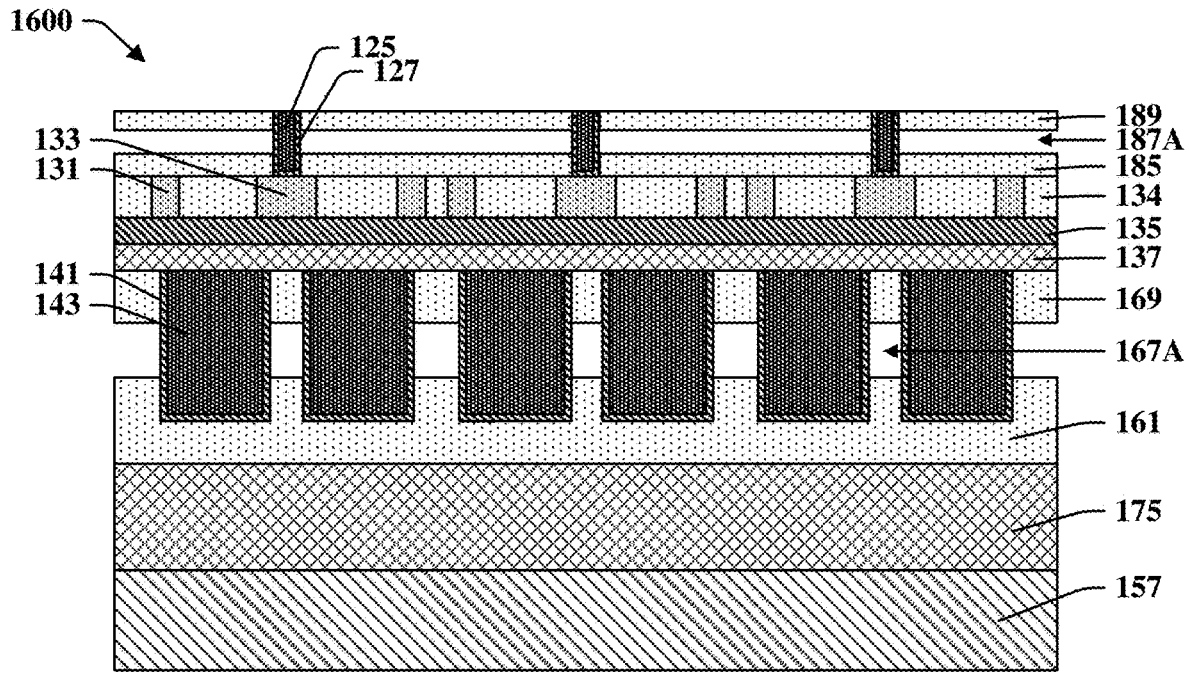
Figure 16B:
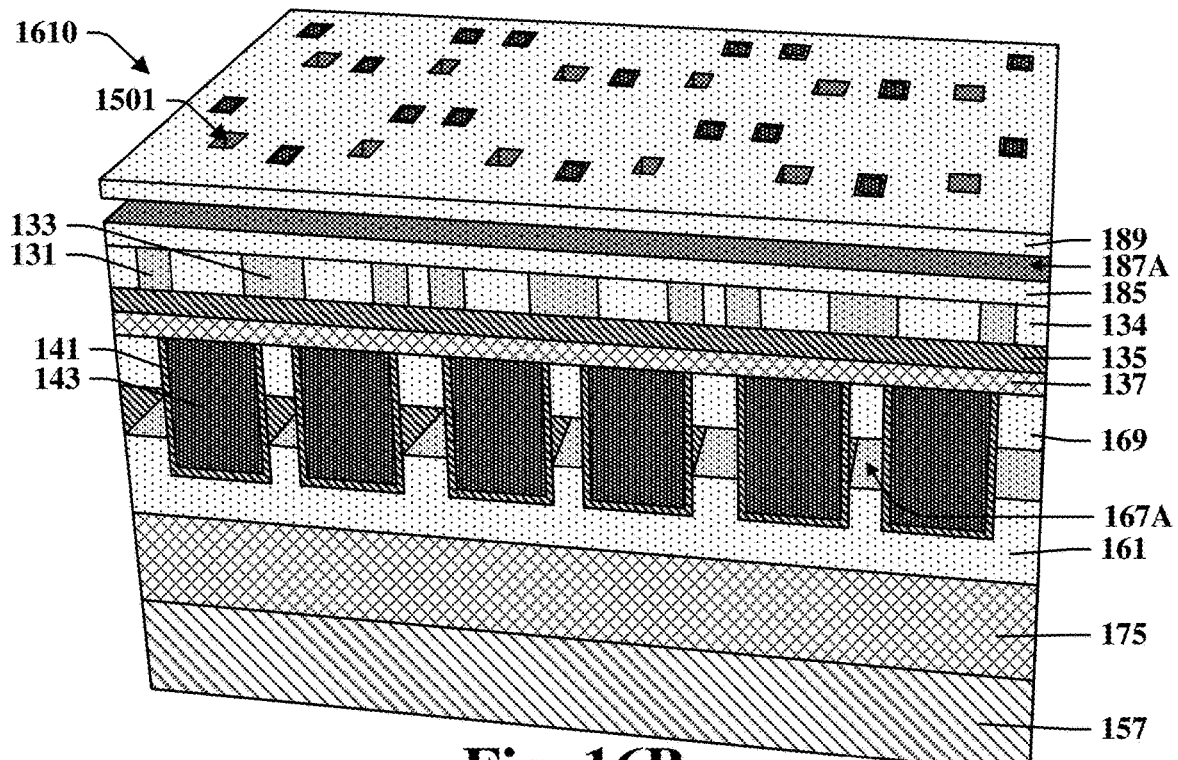

Act 2443 is etching to remove all or part of each of the sacrificial layers with the second multilayer stack. The etch process may again be a wet etch. The perspective view 1610 of FIG. 16B provides an example.

Act 2445 is forming the capacitors 109. Depending on which particular actions within the process 2400 are included, the resulting structure can correspond to any one of the IC devices 100A-100E of FIGS. 1A-1E.

Some aspects of the present disclosure relate to an integrated circuit device that include a cavity within a metal interconnect. A first dielectric layer provides a roof for the cavity. A second dielectric layer provides a floor for the cavity. A material distinct from the first dielectric layer and the second dielectric layer provides a side edge for the cavity.

Some aspects of the present disclosure relate to an integrated circuit device that include a cavity within a metal interconnect. A first dielectric layer provides a roof for the cavity. A second dielectric layer provides a floor for the cavity. The cavity has side edges and a height that is constant over an area away from the side edges.

Some aspects of the present disclosure relate to an integrated circuit device that include a cavity within a metal interconnect. A first dielectric layer provides a ceiling for the cavity. A second dielectric layer provides a floor for the cavity.

Some aspects of the present disclosure relate to an integrated circuit device that include a cavity within a metal interconnect. A first dielectric layer provides a ceiling for the cavity. A second dielectric layer provides a floor for the cavity. The ceiling is flat. In some embodiments, a layer of material that provides a gate dielectric for a BEOL transistor is directly over the first dielectric layer.

Some aspects of the present disclosure relate to a method of manufacturing an integrated circuit device that includes forming a stack comprising a first dielectric layer, a second layer, and a third dielectric layer. The second layer is between the first dielectric layer and the third dielectric layer and has a distinct composition from the first dielectric layer and the third dielectric layer. One or more openings are formed in the third dielectric layer. The second layer is etched through the one or more openings to form a cavity between the first dielectric layer and the third dielectric layer. The one or more openings are sealed so that the cavity remains between the first dielectric layer and the third dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated circuit device, comprising:
    forming a stack comprising a first dielectric layer, a second layer, and a third dielectric layer, wherein the second layer is between the first dielectric layer and the third dielectric layer and has a distinct composition from the first dielectric layer and the third dielectric layer;
    etching trenches in the stack;
    filling the trenches with metal;
    forming one or more openings in the third dielectric layer;
    etching the second layer through the one or more openings to form a cavity between the first dielectric layer and the third dielectric layer; and
    sealing the one or more openings so that the cavity remains between the first dielectric layer and the third dielectric layer.

2. The method of claim 1, wherein:
    the first dielectric layer and the third dielectric layer are oxides; and
    the second layer is a nitride.

3. The method of claim 1, wherein etching progresses until two or more of the one or more openings are connected through a space previously occupied by the second layer.

4. The method of claim 1, wherein the etching leaves the second layer with an area less than one fourth an area of the first dielectric layer.

5. The method of claim 1, further comprising
    lining the trenches with an oxide semiconductor prior to filling the trenches with metal.

6. A method of manufacturing an integrated circuit device, the method comprising:
    providing a partially manufactured device comprising a conductive structure laterally flanked by a dielectric stack comprising at least a first dielectric layer and a second dielectric layer, wherein the first dielectric layer is over the second dielectric layer and has a distinct composition from the second dielectric layer;
forming one or more openings in the first dielectric layer;
using a selective etch process to remove a portion of the second dielectric layer to form a cavity below the first dielectric layer; and
filling the one or more openings to seal off the cavity;
wherein the cavity is positioned to reduce a capacitance of a back-end-of-line transistor.

7. The method of claim 6, wherein the dielectric stack comprises a third dielectric layer below the second dielectric layer and the third dielectric layer has the same composition as the first dielectric layer.

8. The method of claim 7, wherein the first dielectric layer is a silicon oxide and the second dielectric layer is a silicon nitride.

9. The method of claim 6, wherein the conductive structure is metallic and has a metal oxide semiconductor liner.

10. The method of claim 9, wherein the conductive structure is a wire.

11. The method of claim 9, wherein the metal oxide semiconductor liner provides a sidewall for the cavity.

12. The method of claim 6, wherein a roof of the cavity is below a top of the first dielectric layer.

13. The method of claim 6, wherein a roof of the cavity is below the first dielectric layer.

14. The method of claim 6, wherein a gate dielectric for the back-end-of-line transistor is directly over the cavity.

15. A method of manufacturing an integrated circuit device, the method comprising:
forming a dielectric stack comprising a first dielectric layer, a second dielectric layer, and a third dielectric layer, wherein the second dielectric layer is between the first dielectric layer and the third dielectric layer and has a distinct composition from the first dielectric layer and the third dielectric layer;
etching a trench or hole in the dielectric stack;
filling the trench or hole to form a conductive wire or via; and
selectively etching the second dielectric layer to form a cavity between the first dielectric layer and the third dielectric layer.

16. The method of claim 15, wherein filling the trench or hole to form a conductive wire or via comprises lining the trench or hole with a metal oxide semiconductor and then filling the trench or hole with a conductive material that is distinct from the metal oxide semiconductor.

17. The method of claim 16, wherein selectively etching the second dielectric layer extends the cavity to the metal oxide semiconductor.

18. The method of claim 16, wherein selectively etching to form a cavity between the first dielectric layer and the third dielectric layer comprises forming one or more holes in the first dielectric layer and etching the second dielectric layer through the one or more holes.

19. The method of claim 15, wherein the cavity is disposed between two gate electrodes.

20. The method of claim 15 wherein, further comprising:
forming a high-κ dielectric layer over the cavity and over the conductive wire or via;
forming a semiconductor layer over the high-κ dielectric layer; and
forming source and drain regions over the semiconductor layer;
wherein the conductive wire or via provides a gate electrode and the semiconductor layer provides a channel for a back-end-of-line transistor.

* * * * *